(12) United States Patent
Ohuchi et al.

(10) Patent No.: US 8,872,164 B2
(45) Date of Patent: *Oct. 28, 2014

(54) ORGANIC EL ELEMENT

(75) Inventors: Satoru Ohuchi, Osaka (JP); Yoshiaki Tsukamoto, Osaka (JP); Takahiro Komatsu, Osaka (JP); Kei Sakanoue, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/298,528

(22) Filed: Nov. 17, 2011

(65) Prior Publication Data
US 2012/0061656 A1 Mar. 15, 2012

Related U.S. Application Data

(63) Continuation of application No. PCT/JP2010/004471, filed on Jul. 9, 2010.

(30) Foreign Application Priority Data

Aug. 19, 2009 (JP) ................................. 2009-189658

(51) Int. Cl.
H01L 33/02 (2010.01)
H01L 51/50 (2006.01)

(52) U.S. Cl.
CPC ........ *H01L 51/5088* (2013.01); *H01L 51/5004* (2013.01); *H01L 2251/552* (2013.01)
USPC .......... 257/40; 257/88; 257/98; 257/E51.027; 257/E33.013; 257/E51.018; 257/43; 313/498; 313/504; 564/427; 544/225; 427/66; 445/1; 438/46

(58) Field of Classification Search
USPC ............................... 257/40; 313/498; 544/225
See application file for complete search history.

(56) References Cited

U.S. PATENT DOCUMENTS 5,294,869 A 3/1994 Tang et al.
5,443,922 A 8/1995 Nishizaki et al.
(Continued)

FOREIGN PATENT DOCUMENTS

CN 101170124 4/2008
EP 2175504 4/2010
(Continued)

OTHER PUBLICATIONS

Min Jung Son et al., "Interface electronic structures of organic light-emitting diodes with WO3 interlayer: A study by photoelectron spectroscopy", Organic Electronics 10, pp. 637-642 (2009).

(Continued)

*Primary Examiner* — Jerome Jackson, Jr.
*Assistant Examiner* — Bo Fan
(74) *Attorney, Agent, or Firm* — Greenblum & Bernstein, P.L.C.

(57) ABSTRACT

An organic light-emitting element includes an anode, a functional layer, and a hole injection layer between the anode and the functional layer. The functional layer contains an organic material. The hole injection layer injects holes to the functional layer. The hole injection layer comprises tungsten oxide and includes an occupied energy level that is approximately 1.8 electron volts to approximately 3.6 electron volts lower than a lowest energy level of a valence band of the hole injection layer in terms of binding energy.

17 Claims, 14 Drawing Sheets (B, C: a case where there are no injection sites in the tungsten oxide layer and a case where there is a shortage of injection sites in the tungsten oxide layer)

(56) References Cited

U.S. PATENT DOCUMENTS

| | | |
|---|---|---|
| 5,688,551 A | 11/1997 | Littman et al. |
| 6,132,280 A | 10/2000 | Tanabe et al. |
| 6,284,393 B1 | 9/2001 | Hosokawa et al. |
| 6,309,801 B1 | 10/2001 | Meijer et al. |
| 7,785,718 B2 | 8/2010 | Yatsunami et al. |
| 8,058,797 B2 | 11/2011 | Frey et al. |
| 2002/0051894 A1 | 5/2002 | Yoshikawa |
| 2002/0158835 A1 | 10/2002 | Kobayashi et al. |
| 2003/0137242 A1 | 7/2003 | Seki |
| 2004/0178414 A1 | 9/2004 | Frey et al. |
| 2005/0064633 A1 | 3/2005 | Mikoshiba |
| 2005/0170208 A1 | 8/2005 | Yatsunami et al. |
| 2005/0208206 A1 | 9/2005 | Yoshikawa |
| 2005/0266763 A1 | 12/2005 | Kimura et al. |
| 2006/0008931 A1 | 1/2006 | Lee et al. |
| 2006/0204788 A1 | 9/2006 | Yoshikawa |
| 2006/0243377 A1 | 11/2006 | Matsuo et al. |
| 2006/0284166 A1 | 12/2006 | Chua et al. |
| 2007/0029929 A1 | 2/2007 | Nakamura et al. |
| 2007/0034864 A1* | 2/2007 | Liu .................................. 257/40 |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2008/0100209 A1 | 5/2008 | Ito |
| 2008/0150422 A1 | 6/2008 | Ohara |
| 2008/0231179 A1 | 9/2008 | Abe et al. |
| 2008/0312437 A1* | 12/2008 | Inoue et al. .................... 544/225 |
| 2009/0115318 A1 | 5/2009 | Gregory et al. |
| 2009/0160325 A1 | 6/2009 | Yatsunami et al. |
| 2009/0200917 A1* | 8/2009 | Yamagata et al. ............ 313/498 |
| 2009/0243478 A1 | 10/2009 | Shoda et al. |
| 2009/0272999 A1 | 11/2009 | Yoshida et al. |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2010/0102310 A1 | 4/2010 | Komatsu et al. |
| 2010/0213827 A1 | 8/2010 | Yoshida et al. |
| 2010/0252857 A1 | 10/2010 | Yoshida |
| 2010/0258833 A1 | 10/2010 | Okumoto et al. |
| 2010/0302221 A1 | 12/2010 | Okumoto |
| 2011/0037068 A1 | 2/2011 | Yamazaki et al. |
| 2011/0042703 A1 | 2/2011 | Okumoto et al. |
| 2011/0140091 A1* | 6/2011 | Friend et al. .................... 257/40 |
| 2012/0061656 A1 | 3/2012 | Ohuchi et al. |
| 2012/0178191 A1 | 7/2012 | Sakanoue et al. |

FOREIGN PATENT DOCUMENTS

| | | |
|---|---|---|
| JP | 05-163488 | 6/1993 |
| JP | 10-162959 A | 6/1998 |
| JP | 2000-133446 A | 5/2000 |
| JP | 2000-223276 | 8/2000 |
| JP | 2002-075661 A | 3/2002 |
| JP | 2002-530881 A | 9/2002 |
| JP | 2002-318556 A | 10/2002 |
| JP | 2003-007460 A | 1/2003 |
| JP | 3369615 | 1/2003 |
| JP | 2003-249375 A | 9/2003 |
| JP | 2003-264083 A | 9/2003 |
| JP | 2004-139746 A | 5/2004 |
| JP | 2004-228355 | 8/2004 |
| JP | 2004-234901 A | 8/2004 |
| JP | 2004-527093 | 9/2004 |
| JP | 2004-363170 A | 12/2004 |
| JP | 2005-012173 A | 1/2005 |
| JP | 2005-197189 A | 7/2005 |
| JP | 2005-203339 | 7/2005 |
| JP | 2005-203340 | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 | 4/2006 |
| JP | 3789991 | 6/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 | 3/2008 |
| JP | 2008-091072 A | 4/2008 |
| JP | 2008-124268 | 5/2008 |
| JP | 2008-140724 A | 6/2008 |
| JP | 2008-177557 A | 7/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| WO | 2008/120714 A1 | 10/2008 |
| WO | 2008/149498 A1 | 12/2008 |
| WO | 2008/149499 A1 | 12/2008 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

F. Bussolotti et al, "Surface electronic properties of polycrystalline WO3 thin films: a study by core level and valence band photoemission", Surface Science 538, pp. 113-123 (2003).

Qin-Ye Bao et al., "Interfacial electronic structures of WO3-based intermediate connectors in tandem organic light-emitting diodes", Organic Electronics 11, pp. 1578-1583 (2010).

Th. Kugler et al., "Polymer band alignment at the interface with indium tin oxide: consequences for light emitting devices", Chemical Physics Letters 310, pp. 391-396 (1999).

I. N. Yakovkin et al., "Driving force for the WO3(001) surface relaxation", Surface Science 601, pp. 1481-1488 (2007).

J. B. Pedley et al., "Thermochemical Data for Gaseous Monoxides", Journal of Physical and Chemical Reference Data. vol. 12, No. 4, pp. 967-1032 (1983).

M. Stolze et al., "Nature of substoichiometry in reactively DC-sputtered tungsten oxide thin films and its effect on the maximum obtainable colouration by gases", Thin Solid Films 409, pp. 254-264 (2002).

V. Bulovic et al., "Transparent light-emitting devices", Nature, vol. 380, p. 29 (1996).

International Search Report in PCT/JP2010/004471, mailing date of Oct. 5, 2010.

(56) References Cited

OTHER PUBLICATIONS

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters-Ameerican Institute of Physics, vol. 93, 043308 (2008).

Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279, Apr. 2, 2009. (Along with a certified English language translation).

Jingze Li et al., "Enhanced performance of organic light emitting device by inssertion of conducting/insulating WO3 anodic buffer layer", Syntetic Metals 151, pp. 141-146 (2005).

Hiromi Watanabe et al., "Structure and Physical Property Evaluation of $MoO_x$ Thin-Film in Reactive Sputtering Method, and $MoO_x$/α-NPD Boundary Analysis," (Nov. 20, 2008). (Along with a certified English language partial translation).

Kaname Kanai et al., "Electronic structure of anode interface with molybdenum oxide buffer layer", Organic Electronics 11, pp. 188-194 (2010).

Yasuo Nakayama et al., "MoO3 on F8BT Boundary Electron Structure: Research through Photoemission Spectrography and Meta-Stable Excited Atom Spectrometry," (Nov. 20, 2008). (Along with a certified English language partial translation).

English language Abstract of JP 05-258859, published Oct. 8, 1993, which corresponds to JP 3369615.

English language Abstract of JP 09-167684, published Jun. 24, 1997, which corresponds to JP 3789991.

Japan Office Action in Japanese Patent Application No. 2009-189658, dated Apr. 8, 2013.

Stella Tsuushin (Stella communication), Stella Corporation, undated, available at http://www.stellacorp.co.jp/media/conference#past/0902sorst.html, accessed on Apr. 8, 2013, together with a partial English language translation.

L. Chkoda et al., "Work function of ITO substrates and band-offsets at the TPD/ITO interface determined by photoelectron spectroscopy", Synthetic metals 111-112, pp. 315-319 (2000).

U.S. Appl. No. 13/739,363 to Seiji Nishiyama et al., filed Jan. 11, 2013.

U.S. Appl. No. 13/746,485 to Kenji Harada et al., filed Jan. 22, 2013.

U.S. Appl. No. 13/742,593 to Kenji Harada et al., filed Jan. 16, 2013.

U.S. Appl. No. 13/994,164 to Satoru Ohuchi et al., filed Jun. 14, 2013.

U.S. Appl. No. 13/995,205 to Takahiro Komatsu et al., filed Jun. 18, 2013.

International Search Report in PCT/JP2010/004987, dated Sep. 7, 2010.

International Search Report in PCT/JP2010/004993, dated Sep. 7, 2010.

International Search Report in PCT/JP2010/004989, dated Sep. 7, 2010.

International Search Report in PCT/JP2011/000324, dated Feb. 22, 2011.

International Search Report in PCT/JP2012/000288, dated Apr. 17, 2012.

China Office Action from State Intellectual Property Office (SIPO) in Chinese Patent Application No. 201080019186.5, dated Apr. 3, 2014, together with a partial English language translation.

Dinesh Kabra et al., "High Efficiency Composite Metal Oxide-Polymer Electroluminescent Devices: A Morphological and Material Based Investigation", Advanced Materials, vol. 20, Issue 18, pp. 3447-3452 (2008).

United States Interview Summary in U.S. Appl. No. 13/742,593, dated Jun. 4, 2014.

United States Office Action in U.S. Appl. No. 13/994,164, dated Jun. 5, 2014.

United States Notice of Allowance in U.S. Appl. No. 13/995,205, dated May 13, 2014.

Meyer et al., "Charge generation layers comprising transition metal-oxide/organic interfaces: Electronic structure and charge generation mechanism", Applied Physics Letters, 96, 193302, pp. 1-3 (May 2010).

United States Office Action in U.S. Appl. No. 13/742,593, dated Apr. 3, 2014.

United States Office Action in U.S. Appl. No. 13/746,485, dated Apr. 25, 2014.

\* cited by examiner

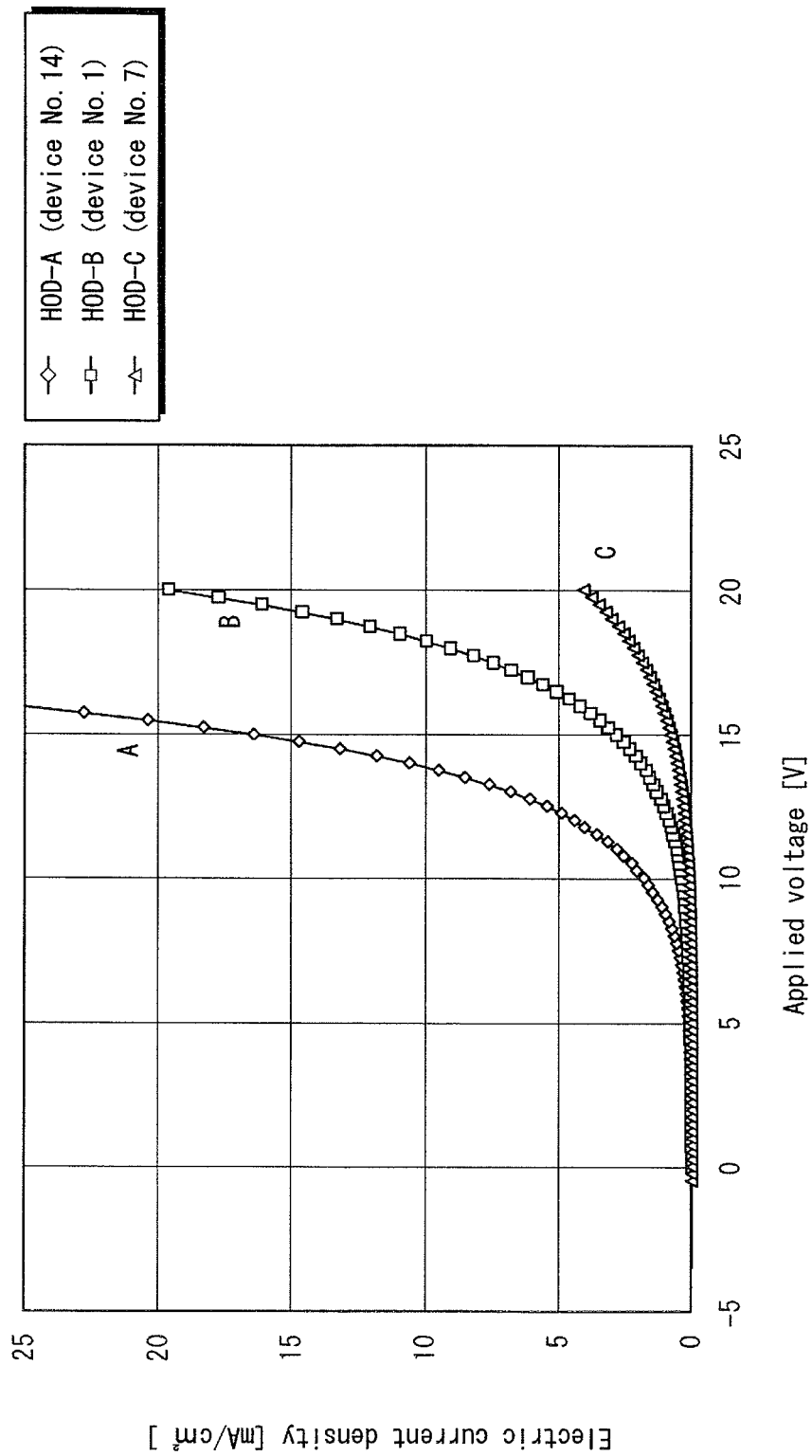

(A: a case where an appropriate number of injection sites exists in the tungsten oxide layer)

(B, C: a case where there are no injection sites in the tungsten oxide layer and a case where there is a shortage of injection sites in the tungsten oxide layer)

ORGANIC EL ELEMENT

CROSS REFERENCE TO RELATED APPLICATION

This is a continuation application of PCT Application No. PCT/JP2010/004471 filed on Jul. 9, 2010, designating the United States of America, the disclosure of which, including the specification, drawings and claims, is incorporated herein by reference in its entirety.

The disclosure of Japanese Patent Application No. 2009-189658 filed on Aug. 19, 2009, including the specification, drawings, and claims, is incorporated herein by reference in its entirety.

BACKGROUND OF THE INVENTION

1. Field of the Invention

The present invention relates to an organic electric-field light-emitting element (referred to hereinafter as an "organic EL element"), which is an electric light emitter. Particularly, the present invention relates to a technology for driving an organic EL element at low electricity while ensuring a wide range of luminous intensity from low luminous intensity to high luminous intensity for the use as a light source or the like.

2. Description of the Related Art

In recent years, progress is being made in research and development of diverse functional elements which involve the use of an organic semiconductor.

Organic EL elements are known as being one of the most common among such functional elements. An organic EL element is a current-driven light emitter, and commonly includes a pair of electrodes consisting of an anode and a cathode, and a functional layer containing organic material disposed between the pair of electrodes. The functional layer includes layers such as a light-emitting layer and a buffer layer. Further, there are cases where a hole injection layer is disposed between the functional layer and the anode. The hole injection layer is disposed for injecting holes to the functional layer. When driving the organic EL element, voltage is applied between the pair of electrodes. The emission of light from the organic EL element is caused by an electric-field light-emitting phenomenon taking place as a result of the recombination of holes which are injected from the anode to the functional layer, and the electrons which are injected from the cathode to the functional layer. Now, more attention is being given to the application of organic EL elements as a light emitter or a light source for various display devices. This owes to the advantageous characteristics of the organic EL element, which include: high visibility resulting from self-luminescence; and excellent shock resistance resulting from the fully solid-state structure thereof.

Organic EL elements can be largely divided into two types, according to the material used for forming the functional layer therein. The first type of organic EL elements is a vapor deposition type. A vapor deposition-type organic EL element has a functional layer that is mainly composed of low molecular material and that is formed as a film by applying a vacuum process such as a vapor deposition method. The second type of organic EL elements is an application type. An application-type organic EL element has a functional layer that is mainly composed of either high molecular material, or low molecular material having an excellent thin film forming property, and that is formed as a film by applying a wet process such as an inkjet method and a gravure printing method.

When comparing the two types of organic EL elements, vapor deposition-type organic EL elements have gained more popularity up to this point, for reasons such as higher light-emitting efficiency of the light-emitting material and longer operating lifetime in comparison with application-type organic EL elements (for instance, refer to Patent Literatures 1 and 2). As a result, vapor deposition-type organic EL elements have already been put into practical use in mobile phone displays, small-sized TVs and the like.

However, although vapor deposition-type organic EL elements may be ideal for use in small-sized organic EL panels, application thereof is extremely difficult, for example, to full-color, large-sized organic EL panels having display sizes of around 100 inches. The difficulty of such an application derives from the technology applied in the manufacturing of a vapor deposition-type organic EL element. For instance, when manufacturing an organic EL panel using vapor deposition-type organic EL elements, a mask vapor deposition method is commonly applied for separately forming light-emitting layers corresponding to each of the colors (for instance R, G, and B) to be displayed on the organic EL panel. However, as the surface area of the organic EL panel to be manufactured becomes larger, it becomes more and more difficult to maintain the precision with which mask position adjustment is performed. This is due to reasons such as the difference in thermal expansion coefficients between the mask and the glass substrate. Hence, the manufacturing of a large-sized display without any deficiencies is extremely difficult when applying vapor deposition-type organic EL elements. One possible countermeasure as to overcome such a problem is using vapor deposition-type organic EL elements having a light-emitting layer formed of white-colored material, and further providing color filters of the respective colors R, G, and B. This excludes the need for the separate application of colors, but however, such a countermeasure has a shortcoming as well. In specific, when taking such a countermeasure, the amount of light which can be actually used is a mere third of the amount of light emitted from the entire light-emitting layer, and thus, more electricity will be consumed, in principle.

As such, attempts are being made to realize the manufacturing of larger organic EL panels by using application-type organic EL elements. As already described in the above, a functional layer is formed by applying a wet process in an application-type organic EL element. In the application of the wet process, the precision with which the application of functional layer material of the respective colors to corresponding positions on the substrate is performed is not influenced by the size of the substrate. Hence, the technical barrier to be overcome in realizing the manufacturing of larger organic EL panels is not as high as in the case of vapor deposition-type organic EL elements.

At the same time, much effort is also being made in research and development of technology for enhancing the light-emitting efficiency of organic EL elements. Efficient injection of carriers (holes and electrons) from the electrodes to the functional layer is essential in causing an organic EL element to emit light with high efficiency, high luminous intensity, and low electrical consumption. Generally, provision of an injection layer in between each of the electrodes and the functional layer is effective in realizing efficient injection of carriers to the functional layer. This is since an injection layer has the function of lowering the energy barrier to be overcome in the injection of carriers. As a hole injection layer, which is one of the injection layers, such films as a vapor deposition film and an application film are commonly used. A vapor deposition film is composed of material such as copper phthalocyanine and molybdenum oxide, whereas an application film is composed of PEDOT or the like. Among such hole injection layers, it has been reported that a vapor deposition film composed of molybdenum oxide contributes to the improvement of hole injection efficiency, as well as to the longevity of the organic EL element (for instance, refer to Patent Literature 3).

CITATION LIST

Patent Literature

Patent Literature 1: Japanese Patent Publication No. 3369615.
Patent Literature 2: Japanese Patent Publication No. 3789991.
Patent Literature 3: Japanese Patent Application Publication No. 2005-203339.

Non-Patent Literature

Non-Patent Literature 1: Jingze Li et al., Synthetic Metals 151, 141 (2005).
Non-Patent Literature 2: Hiromi Watanabe et al., Yuki EL Tohronkai Dai 7 Kai Reikai Yokoushuu, 17 (2008).
Non-Patent Literature 3: Hyunbok Lee et al., Applied Physics Letters 93, 043308 (2008).
Non-Patent Literature 4: Kenji Koizumi et al., Dai 56 Kai Ouyou Butsurigaku Kankei Rengou Kouenkai Yokoushuu, 30p-ZA-11 (2009).
Non-Patent Literature 5: Yasuo Nakayama et al., Yuki EL Tohronkai Dai 7 Kai Reikai Yokoushuu, 5 (2008).

SUMMARY OF THE INVENTION

However, despite such advantages as described above of application-type organic EL elements, problems to be overcome similarly exist, especially in the manufacturing thereof.

In the manufacturing of an organic EL panel using application-type organic EL elements, barrier ribs (hereinafter referred to as banks) are disposed separating each of the pixels of the organic EL panel. Each of the pixels corresponds to an organic EL element, and the banks are disposed between the pixels to enable accurate application of application solution containing functional material to a predetermined pixel. In the provision of such banks, it is required that the contact angle of the bank with respect to the application solution is large. On the other hand, it is also required that the contact angle of the application surface with respect to the application solution is small. Therefore, in the manufacturing of an application-type organic EL element, firstly, the hole injection layer (whose contact angle with respect to the application solution is small) is formed, and subsequently, the banks (whose contact angle with respect to the application solution is large) are formed on the hole injection layer. As is described in the following, the forming of the banks involves the use of alkaline solutions, water, organic solvents, etc.

In the bank forming process, the photolithography method is commonly applied. The bank forming process applying the photolithography method includes the following steps of: (i) applying bank material composed of photosensitive resist material onto the surface of the hole injection layer; (ii) pre-baking the bank material; (iii) exposing the bank material to light while using a pattern mask, (iv) removing unhardened, redundant bank material by using a developer composed of an alkaline solution or the like; and (v) rinsing the hole injection layer having the banks formed on a surface thereof with pure water. Note that the steps (i) through (v) are to be performed sequentially.

As could be seen from the above, several types of solutions are applied in the bank forming process. Therefore, it is technically difficult to use, for forming the hole injection layer, material which easily dissolves to such solutions, and which is easily deteriorated or decomposed when put into contact with such solutions. One example of such a material is molybdenum oxide. Such problems as dissolution, decomposition, and degradation of the hole injection layer is problematic since the hole injection efficiency of the hole injection layer will be impaired. Such impairment may ultimately result in the organic EL element no longer being able to operate properly. Moreover, such a hole injection layer will not be able to withstand processing performed during mass production of organic EL elements and organic EL panels incorporating such organic EL elements.

In view of such problems, the present invention provides an organic EL element having a hole injection layer which exhibits excellent hole injection efficiency and which, at the same time, is able to withstand processing performed during mass production of organic EL panels.

That is, the aim of the present invention is to provide an organic EL element which has a reduced hole injection barrier between the hole injection layer and the functional layer, and which exhibits excellent hole injection efficiency. As such, the organic EL element pertaining to the present invention is expected to drive in excellent state under low voltage. Further, the hole injection layer of the organic EL element is expected to have resistance with respect to dissolution, decomposition, and degradation during the bank forming process. As such, the organic EL element pertaining to the present invention is able to withstand processing performed during the mass production of organic EL panels.

In view of the above-presented problems, one aspect of the present invention is an organic EL element comprising: an anode; a functional layer containing organic material; and a hole injection layer for injecting holes to the functional layer, the hole injection layer disposed between the anode and the functional layer, wherein the hole injection layer contains tungsten oxide and has, in an electronic state thereof, an occupied energy level that is 1.8 eV to 3.6 eV lower than the lowest energy level of a valence band of the hole injection layer, in terms of binding energy.

One aspect of the present invention is an organic EL element having a hole injection layer which contains tungsten oxide. Further, the hole injection layer has, in an electronic state thereof, an occupied energy level which is 1.8 eV to 3.6 eV lower than the lowest energy level of a valence band of the hole injection layer, in terms of binding energy. By the hole injection layer having such an occupied energy level, the hole injection barrier between the hole injection layer and the functional layer is suppressed to a low level. Resultantly, the organic EL element which is one aspect of the present invention has excellent hole injection efficiency, can be driven at a low voltage, and is expected to exhibit excellent light-emitting efficiency.

Additionally, the organic EL element, which is one aspect of the present invention, has a hole injection layer constituted of tungsten oxide, which exhibits high chemical stability. Accordingly, the dissolution, decomposition, and degradation of the hole injection layer by alkaline solutions, water, organic solvents, etc., during a bank forming process is suppressed. Thus, the hole injection layer is able to maintain its form and its excellent hole injection efficiency throughout and after the manufacturing process of the organic EL element. This allows the manufacturing of an organic EL element which is able to withstand processing performed during the mass production of organic EL panels.

BRIEF DESCRIPTION OF THE DRAWINGS

FIG. 4 is a device characteristics diagram showing a relation curve illustrating a relation between applied voltage and electric current density of the hole-only devices;

DESCRIPTION OF THE PREFERRED EMBODIMENT(S)

Figure 1:
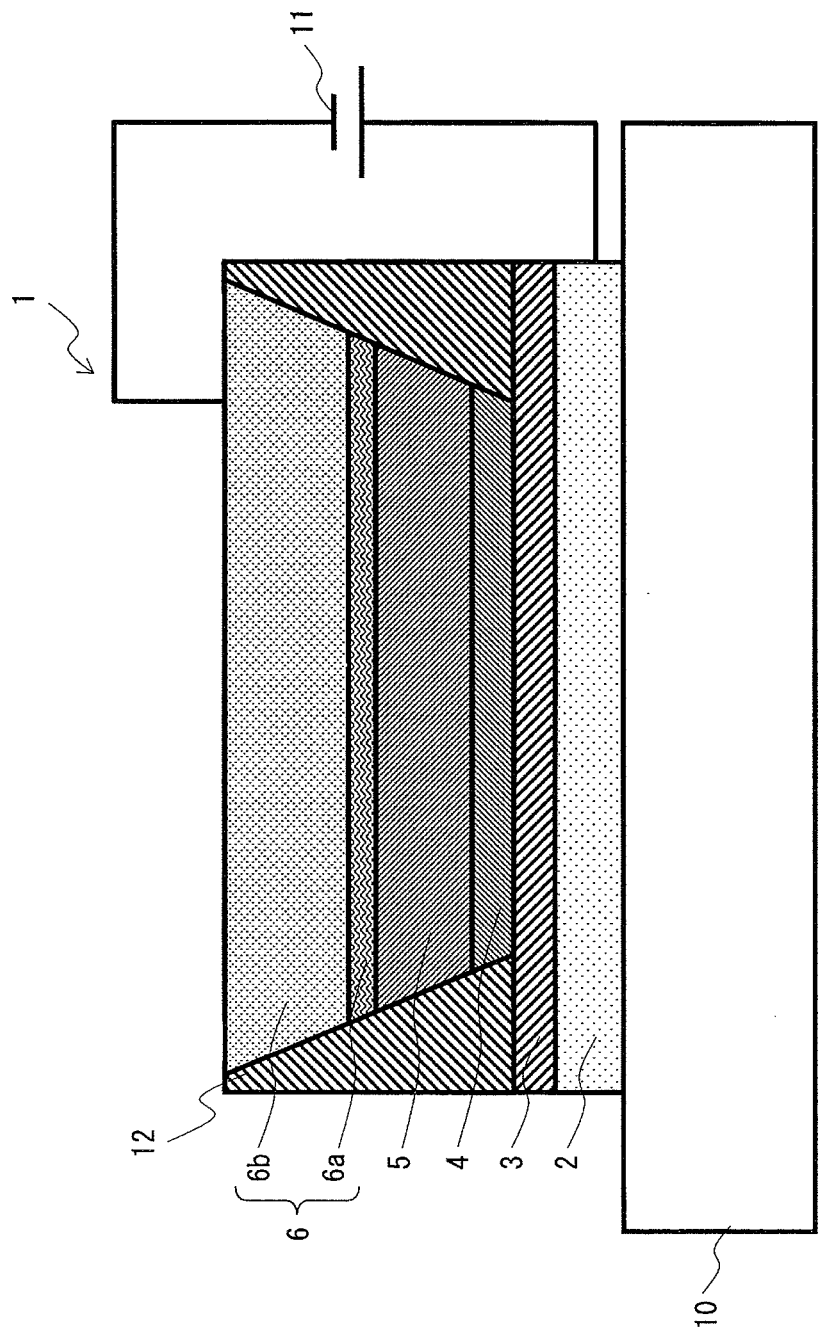
FIG. 1 is a schematic cross-sectional view illustrating a structure of an organic EL element pertaining to an embodiment of the present invention.

One aspect of the present invention is an organic EL element comprising: an anode; a functional layer containing organic material; and a hole injection layer for injecting holes to the functional layer, the hole injection layer disposed between the anode and the functional layer, wherein the hole injection layer contains tungsten oxide and has, in an electronic state thereof, an occupied energy level that is 1.8 eV to 3.6 eV lower than the lowest energy level of a valence band of the hole injection layer, in terms of binding energy.

In the organic EL element, the occupied energy level may be near an energy level of the highest occupied molecular orbital of the functional layer, in terms of binding energy, at an interface between the hole injection layer and the functional layer.

Further, at an interface between the hole injection layer and the functional layer, a gap between the occupied energy level and an energy level of the highest occupied molecular orbital of the functional layer, in terms of binding energy, may be equal to or less than 0.3 eV.

In addition, a UPS spectrum of the hole injection layer may exhibit an upward protrusion between a point 1.8 eV lower than the lowest energy level of the valence band and another point 3.6 eV lower than the lowest energy level of the valence band, in terms of binding energy. Similarly, an XPS spectrum of the hole injection layer may exhibit an upward protrusion between a point 1.8 eV lower than the lowest energy level of the valence band and another point 3.6 eV lower than the lowest energy level of the valence band, in terms of binding energy.

Furthermore, a differential spectrum obtained by differentiating a UPS spectrum of the hole injection layer may exhibit a shape which is expressed by a function other than an exponential function, throughout a range between a point 2.0 eV lower than the lowest energy level of the valence band and another point 3.2 eV lower than the lowest energy level of the valence band, in terms of binding energy.

Additionally, the functional layer may comprise amine-containing material.

Further in addition, the functional layer may include at least one of: a hole transfer layer that transfers holes; a light-emitting layer that emits light by recombination of electrons and holes injected thereto; and a buffer layer for either one of (i) adjustment of optical characteristics of the organic El element and (ii) blocking of electrons.

Also, the occupied energy level may be 2.0 eV to 3.2 eV lower than the lowest energy level of the valence band, in terms of binding energy.

Another aspect of the present invention is a display device comprising the above-described organic EL element.

Yet another aspect of the present invention is a manufacturing method for an organic EL element, the manufacturing method comprising: a first step of preparing an anode; a second step of forming a tungsten oxide layer with respect to the anode by introducing a gas composed of argon gas and oxygen gas to a chamber of a sputtering device, the forming of the tungsten oxide layer performed under conditions where (i) a total pressure of the gas in the chamber is higher than 2.7 Pa and lower than or equal to 7.0 Pa; (ii) a partial pressure ratio of the oxygen gas is higher than or equal to 50% and lower than or equal to 70% with respect to the total pressure of the gas in the chamber; and (iii) an input power density per unit surface area of the sputtering target is higher than or equal to 1 W/cm$^2$ and lower than or equal to 2.8 W/cm$^2$; a third step of forming a functional layer containing organic material with respect to the tungsten oxide layer so formed; and a fourth step of forming a cathode above the functional layer.

In the second step of the manufacturing method, the tungsten oxide layer may be formed such that a UPS spectrum of the hole injection layer exhibits an upward protrusion between a point 1.8 eV lower than the lowest energy level of the valence band and another point 3.6 eV lower than the lowest energy level of the valence band, in terms of binding energy.

Further, in the second step of the manufacturing method, the tungsten oxide layer may be formed such that a differential spectrum obtained by differentiating a UPS spectrum of the tungsten oxide layer exhibits a shape which is expressed by a function other than an exponential function, throughout a range between a point 2.0 eV lower than the lowest energy level of the valence band and another point 3.2 eV lower than the lowest energy level of the valence band, in terms of binding energy.

In the following, description is provided on an organic EL element pertaining to the embodiment of the present invention. Subsequently, results and observations will be presented for each of the experiments having been performed to assess the efficiency of the present invention.

It is to be noted that, in each of the accompanying figures, the relation between sizes of each of the members are not illustrated directly reflecting the actual relation.

Embodiment

Structure of Organic EL Element

FIG. 1 is a schematic cross-sectional view illustrating the structure of an organic EL element 1 pertaining to the embodiment.

The organic EL element 1 is an application-type organic EL element, which is characterized in that a functional layer is applied by a wet process in the manufacturing thereof. The organic EL element 1 includes: a hole injection layer 3; various functional layers (a buffer layer 4 and a light-emitting layer 5, in this case); and a pair of electrodes composed of an anode 2 and a cathode 6. The hole injection layer 3 and the functional layers are disposed one on top of the other, and are disposed between the pair of electrodes. Each of the functional layers contains functional material having a predetermined function.

More specifically, the organic EL element 1 includes, as illustrated in FIG. 1, the anode 2, the hole injection layer 3, the buffer layer 4, the light-emitting layer 5, and the cathode 6 (composed of a barium layer 6a an aluminum layer 6b), which are disposed in the stated order on one main surface of a substrate 10.

The anode 2 is a 50 nm-thick thin film of ITO.

(Hole Injection Layer)

The hole injection layer 3 is composed of a 30 nm-thick tungsten oxide thin film (layer). In the composition formula (WOx) denoting the composition of tungsten oxide, x is a real number existing within a range of approximately 2<x<3.

Concerning the hole injection layer 3, it is preferable that the hole injection layer 3 consist of only tungsten oxide. However, the inclusion of a trace level of impurities is acceptable, provided that the amount does not exceed the amount of impurities which may be incorporated as a result of normal processing.

Here, the hole injection layer 3 is formed under specific conditions. It is by forming the hole injection layer under such specific conditions that the hole injection layer is provided, in an electronic state thereof, with an occupied energy level which is 1.8 eV to 3.6 eV lower than the lowest energy level of a valence band of the hole injection layer, in terms of binding energy. Furthermore, the occupied energy level corresponds to the energy level of the highest occupied molecular orbital (HOMO) of the hole injection layer 3. That is, in the electronic state of the hole injection layer 3, the occupied energy level is closest to the Fermi surface of the hole injection layer 3, in terms of binding energy. As such, the occupied energy level of the hole injection layer is referred to as "the occupied energy level near the Fermi surface" in the following description.

The existence of the occupied energy level near the Fermi surface results in a so-called interface energy level alignment being formed at an interface between the hole injection layer 3 and the functional layer (the buffer layer 4, in this case). By the interface energy level alignment being formed, the energy level of the HOMO of the buffer layer 4 substantially equals the occupied energy level near the Fermi surface of the hole injection layer 3, in terms of binding energy.

Note that the expressions "substantially equals" and "interface energy level alignment being formed" as referred to herein indicate a state where a gap between the lowest occupied energy level near the Fermi surface of the hole injection layer 3 and the lowest energy level of the HOMO of the functional layer, at an interface between the hole injection layer and the functional layer, is equal to or less than 0.3 eV in terms of binding energy.

Furthermore, the expression "interface" as referred to here denotes an area which includes a surface of the hole injection layer 3 facing the buffer layer 4, and a portion of the buffer layer 4 which is within 0.3 nm in distance from the surface of the hole injection layer 3 facing the buffer layer 4.

Concerning the occupied energy level, it is preferable that the occupied energy level near the Fermi surface is provided to all portions of the hole injection layer 3. However, the present invention is not limited to this. Other cases are included within the scope of the present invention, provided that the occupied energy level near the Fermi surface is provided at least at the interface between the hole injection layer 3 and the buffer layer 4.

(Banks)

On the surface of the hole injection layer 3, banks 12 composed of organic material with insulating property (for instance, acrylic resins, polyimide resins, novolac-type phenolic resins and the like) are formed. The banks 12 are disposed such that each of the banks has a uniform trapezoidal cross-section, and such that the banks form either a line bank structure or a pixel bank structure on the surface of the hole injection layer 3. By the provision of the banks 12, the surface of the hole injection layer 3 is divided into a plurality of sections. At each of the sections on the surface of the hole injection layer 3, a functional layer is formed. The functional layer includes the buffer layer 4, and a light-emitting layer 5 of a corresponding color among the colors of R, G, and B. As is illustrated in FIG. 1, when applying the organic EL element 1 to an organic EL panel, a plurality of units (pixels) of organic EL elements 1 are disposed in parallel on the surface of the substrate 10. More specifically, each unit, or pixel, is a series of three organic EL elements 1, and each of the three organic EL elements 1 in a pixel is allocated to a corresponding one of the colors R, G, and B.

Here, it should be noted that the banks 12 are not essential to the present invention, and when an organic EL element 1 is to be used alone, the banks need not be formed.

(Buffer Layer)

The buffer layer 4 is a 20 nm-thick layer of TFB (poly(9, 9-di-n-octylfluorene-alt-(1,4-phenylene-((4-sec-butylphenyl)imino)-1, 4-phenylene)), which is an amine-containing organic polymer.

(Light-Emitting Layer)

The light-emitting layer 5 is a 70 nm-thick layer of F8BT (poly(9,9-di-n-octylfluorene-alt-benzothiadiazole)), which is an organic polymer. However, the material to be used in forming the light-emitting layer 5 is not limited to this, and the light-emitting layer 5 may include a commonly-known organic material. Examples of such commonly-known organic material for the light-emitting layers 5 include fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

(Functional Layer)

The functional layer of the present invention is either one of, a combination of more than two of, or all of layers such as a hole transfer layer, a light-emitting layer, and a buffer layer. The hole transfer layer transfers holes, the light-emitting layer emits light as a result of recombination of holes and electrons which are injected thereto, and the buffer layer is used for adjusting optical characteristics of the organic EL element 1 or for blocking electrons. Although the target of the present invention is the hole injection layer, an organic EL element commonly includes layers having each of the functions of the above-described hole transfer layer, light-emitting layer and the like, in addition to the hole injection layer. As such, the expression "functional layer" in the embodiment refers to all such layers which need to be included in the organic EL element, in addition to the hole injection layer.

(Electrodes, Substrate, etc.)

The cathode 6 includes a 5 nm-thick barium layer 6a and a 100 nm-thick aluminum layer 6b, which are disposed one on top of the other.

The anode 2 and the cathode 6 are connected to a power supply 11, and thereby the organic EL element 1 is supplied with power from the outside.

The substrate 10 may be formed with one of insulating materials such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

(Effects and Advantages Produced by the Organic EL Element)

As described in the above, the organic EL element 1 includes the hole injection layer 3 having the occupied energy level near the Fermi surface. Thus, the hole injection barrier between the hole injection layer 3 and the buffer layer 4 is lowered. Hence, when voltage is applied to the organic El element 1 during driving thereof, holes are injected smoothly, and at a low voltage, from the occupied energy level near the Fermi surface of the hole injection layer 3 to the HOMO of the buffer layer 4. As a result, the organic EL element 1 of the present invention exhibits excellent hole injection efficiency.

Note that there has been a report made of the technology of applying tungsten oxide as the material of the hole injection layer (refer to Non-Patent Literature 1). However, the hole injection layer as obtained in Non-Patent Literature 1 has an exemplary thickness of approximately 0.5 nm, and the voltage-electric current characteristics of the hole injection layer depends largely on film thickness. Thus, the hole injection layer of Non-Patent Literature 1 does not exhibit a level of practicality which enables application thereof to the mass production of large-sized organic EL panels. Furthermore, Non-Patent Literature 1 does not suggest forming the occupied energy level near the Fermi surface in the hole injection layer in a constructive manner. Hence, it is concluded that the present invention largely differs from conventional technology. The present invention is characterized in that a predetermined occupied energy level near the Fermi surface is provided to a chemically-stable hole injection layer that is composed of tungsten oxide and that withstands processing during mass production of large-sized organic EL panels. This provides the hole injection layer with excellent hole injection efficiency, and enables the organic EL element to be driven at a low voltage.

In the following, description is provided of an example of a method for manufacturing the entire the organic EL element 1.

(Manufacturing Method of the Organic El Element)

Firstly, the substrate 10 is mounted inside a chamber of a sputtering film-forming device. Then, a predetermined sputtering gas is introduced into the chamber, and the 50 nm-thick anode 2 composed of ITO is formed according to the reactive sputtering method.

The forming of the hole injection layer 3 is performed subsequently. Here, it is preferable that the hole injection layer 3 be formed similarly according to the reactive sputtering method. Especially, in a case where the organic EL element of the present invention is to be applied to a large-sized organic EL panel, the hole injection layer needs to be formed over a large area. In such a case, the forming of the hole injection layer according to the vapor deposition method is problematic in that there is a risk that unevenness may be formed in terms of film thickness, etc. The occurrence of such unevenness can be readily prevented by forming the hole injection layer 3 according to the reactive sputtering method.

More specifically, the reactive sputtering method is performed after replacing the previous sputtering target with metal tungsten. Further, argon gas and oxygen gas are respectively introduced into the chamber as the sputtering gas and the reactive gas. Under this condition, the argon in the argon gas is ionized by the application of high voltage, and the ionized argon is caused to bombard the sputtering target. The metal tungsten ejected as a result of the sputtering phenomenon reacts with the oxygen, and produces tungsten oxide. As a result, the "sputtered" tungsten oxide forms a film on the anode 2 of the substrate 10.

Note that in the forming of the hole injection layer 3, it is preferable that the tungsten oxide film be formed under conditions where: (i) gas pressure (total gas pressure) is higher than 2.7 Pa and lower than or equal to 7.0 Pa; (ii) the ratio of oxygen partial pressure to the total gas pressure is higher than or equal to 50% and lower than or equal to 70%; and (iii) input power per unit surface area of the sputtering target (input power density) is higher than or equal to 1 W/cm$^2$ and lower than or equal to 2.8 W/cm$^2$. By forming the hole injection layer 3 under such conditions, the hole injection layer 3 having an occupied energy level which is 1.8 eV to 3.6 eV lower than the lowest energy level of a valence band of the hole injection layer, in terms of binding energy, is yielded.

Subsequently, as the material for forming the banks 12, photosensitive resin material or, more preferably, photoresist material containing fluorine material is to be prepared. In order to form the banks 12, first, the bank material so prepared is uniformly applied on the hole injection layer 3. After performing prebaking, a mask having an aperture of a predetermined shape (a pattern of the banks 12 to be formed) is placed over the prebaked bank material. After exposing the bank material to light from over the mask, unhardened, redundant bank material is removed by using a developer. Finally, by performing rinsing with pure water, the banks 12 are yielded.

Here, it should be noted that in the embodiment of the present invention, the hole injection layer 3 is composed of tungsten oxide. Tungsten oxide has resistance with respect to dissolution, decomposition, and degradation by alkaline solutions, water, organic solvents, etc. For this resistance, even when the hole injection layer 3 having been formed falls into contact with such solutions, pure water, etc. in the subsequent bank forming process, damage to the hole injection layer 3, by dissolution, decomposition, degradation and the like, is prevented. Thus, the hole injection layer 3 maintains an appropriate form thereof at the completion of the manufacturing of the organic EL element 1. This too, in addition to the above-described characteristics of the present invention, enables the efficient injection of holes to the buffer layer 4 via the hole injection layer 3, and further enables the organic EL element 1 to be driven at a low voltage.

Following this, the buffer layer 4 is formed by ejecting drops of ink composition containing organic amine-containing molecular material onto a surface of the hole injection layer 3, which is exposed from between adjacent ones of banks 12, and removing the solvent of the ink composition by volatilization. The ejection of ink composition is performed according to a wet process, such as the inkjet method and the gravure printing method.

Following the forming of the buffer layer 4, drops of ink composition containing organic light-emitting material is ejected onto the surface of the buffer layer 4, and again, the solvent of the ink composition is removed by volatilization by applying a similar method as in the forming of the buffer layer 4. Thus, the light-emitting layer 5 is formed.

Here, it should be noted that the method applied for forming the buffer layer 4 and the light-emitting layer 5 is not limited to the above-described method. Other commonly-known methods besides the inkjet method and the gravure printing method may be applied for the ejection/application of ink. Such commonly-known methods include: the dispenser method; the nozzle coating method; the spin coating method; the intaglio printing method; the relief printing method and the like. Subsequently, the barium layer 6a and the aluminum layer 6b are formed on a surface of the light-emitting layer 5 by applying the vacuum vapor deposition method. Thus, the cathode 6 is formed.

It should be noted that, although not illustrated in FIG. 1, a sealing layer may be additionally provided on the surface of the cathode 6, or a sealing cap may be provided to isolate the entire organic EL element 1 from external space, in order as to prevent atmospheric exposure of the organic EL element 1. The sealing layer may be formed, for instance, by using materials such as SiN (silicon nitride) and SiON (silicon oxynitride), and may be disposed such that the organic EL element 1 is sealed therein. When using a sealing cap to prevent atmospheric exposure of the organic EL element 1, the sealing cap may be formed by using, for instance, the same material as the substrate 10, and a getter which absorbs moisture and the like may be provided within the sealed space formed by the substrate 10 and the sealing cap.

By following the above-provided procedures, the manufacturing of the organic EL element 1 is completed.

<Experiments and Observations>
(Conditions for Forming the Tungsten Oxide Layer)

In the embodiment of the present invention, the hole injection layer 3 is yielded by forming a film of tungsten oxide under predetermined conditions. The forming of the tungsten oxide film under such film forming conditions provides the hole injection layer 3 with the occupied energy level near the Fermi surface, which results in the hole injection barrier between the injection layer 3 and the buffer layer 4 being reduced. Furthermore, the organic EL element 1 having a hole injection layer formed under such film forming conditions can be driven at a low voltage.

In order as to obtain a tungsten oxide film having the above-described characteristics, a DC magnetron sputtering device is used in the forming thereof. The sputtering target is metal tungsten, and the processing is performed while not controlling substrate temperature, and by introducing argon gas and oxygen gas into the chamber of the sputtering device. In such an environment, the tungsten oxide film is formed by applying the reactive sputtering method under film forming conditions where: (i) gas pressure (total gas pressure) is higher than 2.7 Pa and lower than or equal to 7.0 Pa; (ii) the ratio of oxygen partial pressure to the total gas pressure is higher than or equal to 50% and lower than or equal to 70%; and (iii) input power per unit surface area of the sputtering target (input power density) is higher than or equal to 1 $W/cm^2$ and lower than or equal to 2.8 $W/cm^2$.

The effectiveness of such film forming conditions (i) through (iii) have been proved through the following experiments.

Firstly, the inventors prepared hole-only devices as assessment devices to be used in accurately determining the dependence of hole injection efficiency on the conditions under which the tungsten oxide film is formed. Needless to say, here the expression "hole injection efficiency" refers to the efficiency with which holes are injected into the buffer layer 4 from the hole injection layer 3.

Basically, in an organic EL element, electric current is formed of carriers, which consists of holes and electrons. As such, the electrical characteristics of an organic EL element reflects electron current as well as hole current. However, since, in a hole-only device, the injection of electrons from the cathode is blocked, there is almost no flow of electron current. Thus, electrical current flowing in a hole-only device consists almost entirely of hole current. In other words, it could be considered that only holes function as a carrier in a hole-only device. Thus, a hole-only device is ideal in making an assessment of hole injection efficiency.

Figure 2:
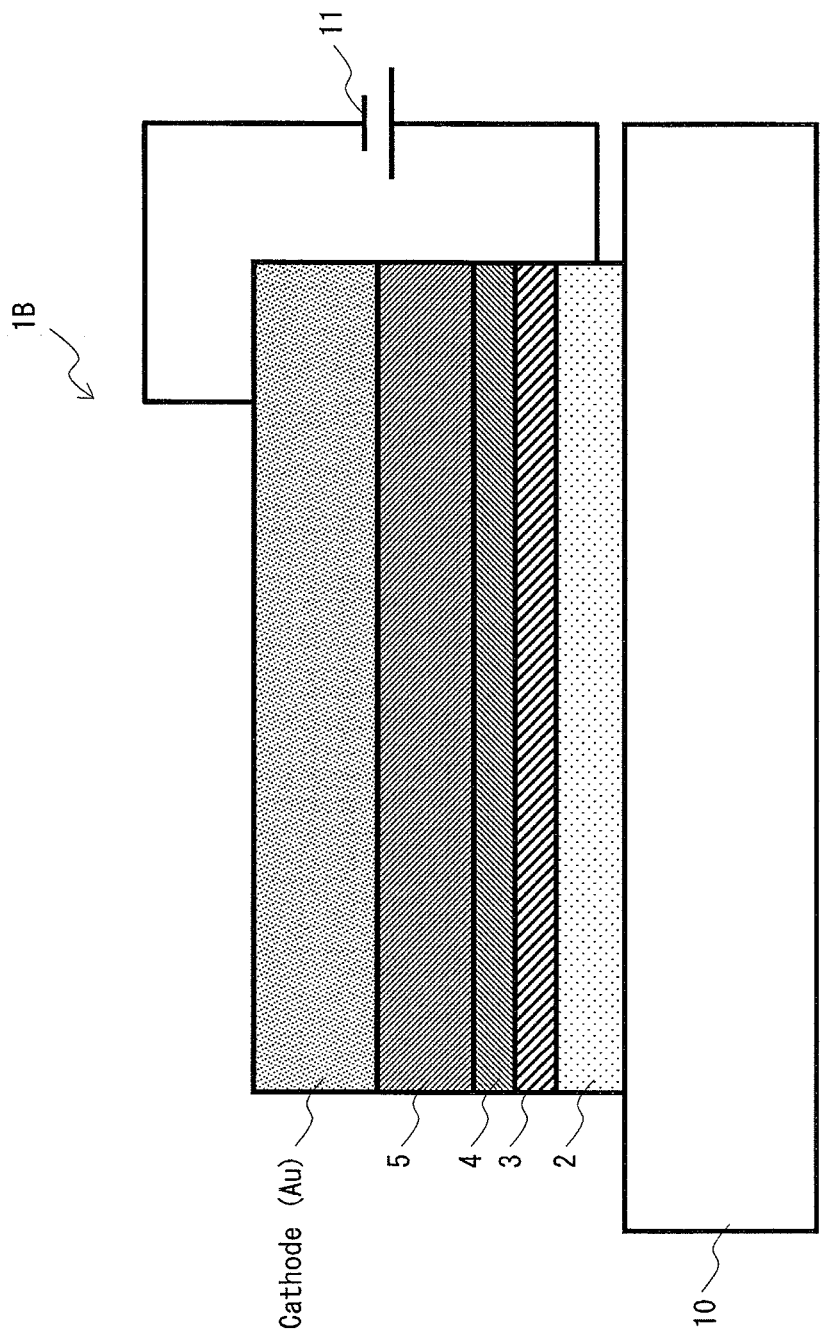
FIG. 2 is a schematic cross-sectional view illustrating a structure of a hole-only device.

In detail, the hole-only devices prepared by the inventors were actually obtained by replacing the cathode 6 of the organic EL element 1 illustrated in FIG. 1 with gold (Au) to form a cathode 9 as illustrated in FIG. 2. That is, the inventors obtained the hole-only device illustrated in FIG. 2 by forming a 50 nm-thick anode 2 composed of an ITO thin film on a substrate 10, and further disposing, on the anode 2 so formed, the following layers in the order in which they are introduced: a 30 nm-thick hole injection layer 3 composed of tungsten oxide; a 20 nm-thick buffer layer 4 composed of TFB, which is an organic amine-containing polymer; a 70 nm-thick light-emitting layer 5 composed of F8BT, which is an organic polymer; and a 100 nm-thick cathode 9 composed of gold. Note that, considering that the hole-only devices are devices prepared for the sole sake of assessment, the banks 12 included in the structure of the organic EL element 1 are omitted from the structure of the hole-only devices.

In the manufacturing of the hole-only devices, the hole injection layers 3 of the hole-only devices were similarly formed by applying the reactive sputtering method in a DC magnetron sputtering device. The gas introduced into the chamber was composed of at least one of argon gas and oxygen gas, and the sputtering target used was metal tungsten. Further, no control was performed regarding substrate temperature, while control of argon partial pressure, oxygen partial pressure, and total gas pressure within the chamber was performed by adjusting the flow amount of the respective gases. Further, in order as to obtain the hole-only devices, changes were made to certain film forming conditions, namely total gas pressure, oxygen partial pressure, and input power, as illustrated in Table 1. As a result, hole-only devices 1B (devices No. 1 through 14), each having a hole injection layer 3 formed under different film forming conditions, were obtained. Note that, hereinafter, oxygen partial pressure is indicated as a ratio (%) with respect to the total pressure of the gases in the chamber of the sputtering device.

TABLE 1

Film forming Conditions of the Hole-only Devices 1B

| | Device No. | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Oxygen Partial Pressure (%) | 70 | 50 | 100 | 50 | 70 | 100 | 70 | 50 | 100 | 50 | 70 | 30 | 30 | 50 |
| Total Pressure (Pa) | 2.7 | 4.8 | 1.7 | 1.7 | 2.7 | 1.7 | 2.7 | 4.8 | 1.7 | 2.7 | 1.7 | 1.7 | 2.7 | 4.8 |
| Input Power (W) | 500 | 500 | 500 | 500 | 250 | 250 | 1000 | 1000 | 1000 | 500 | 500 | 500 | 500 | 250 |
| T-S (mm) | 113 | 113 | 113 | 113 | 113 | 113 | 113 | 113 | 113 | 113 | 113 | 113 | 113 | 113 |
| Film Forming Rate (nm/s) | 0.164 | 0.14 | 0.111 | 0.181 | 0.057 | | 0.308 | 0.311 | 0.246 | 0.154 | 0.153 | 0.364 | 0.177 | 0.049 |
| Film Thickness (nm) | 30 | 30 | 30 | 30 | 30 | 30 | 30 | 30 | 30 | 30 | 30 | 30 | 30 | 30 |

Table 2 illustrates a relation between input power and input power density of the above-presented DC magnetron sputtering device.

TABLE 2

| Input Power (W) | Input Power Density (W/cm$^2$) |
|---|---|
| 250 | 1.4 |
| 500 | 2.8 |
| 1000 | 5.6 |

Following the completion of the preparation of the hole-only devices 1B, the inventors connected each of the hole-only devices 1B to a direct current power supply 11, and applied voltage thereto. Further, the inventors obtained an electric current value per unit surface area (current density) for each of the hole-only devices 1B. More specifically, the voltage applied to the hole-only devices was changed, and a value indicating electric current flowing was obtained at different voltages. Further, conversion was performed on the electric current values to obtain an electric current density value of the hole-only devices 1B. Note that hereinafter, the expression "driving voltage" refers to different voltages applied to the hole-only devices 1B when the current density value is 10 mA/cm$^2$.

In short, it could be said that the smaller the driving voltage, the higher the hole injection efficiency of the hole injection layer 3 is. This is since, the members composing the hole-only devices 1B, other than the hole injection layer 3, are prepared according to the same manufacturing method, and thus, it could be assumed that the hole injection barrier between two adjacent layers, other than the hole injection layer 3, is uniform in each of the hole-only devices 1B. In addition, it has been confirmed through another experiment that the cathode 2 and the hole injection layer 3 in each of the hole-only devices 1B used in this experiment are in ohmic contact. Considering the above, it could be expected that the differences in driving voltage of the hole-only devices 1B resulting from the different film forming conditions strongly reflects the hole injection efficiency from the hole injection layer 3 to the buffer layer 4 in each of the hole-only devices 1B.

Table 3 illustrates each of the hole-only devices 1B and a driving voltage thereof. Further, the hole only devices are classified in Table 3 according to the film forming conditions under which the hole injection layer 3 of each of the hole-only devices 1B was formed. More specifically, classification is made according to the film forming conditions of: total pressure; oxygen partial pressure; and input power. Note that the numbers enclosed in circles in Table 3 indicate the device number of each of the hole-only devices 1B.

TABLE 3

Film Forming Conditions and Driving Voltages of the Hole-only Devices 1B
(Applied Voltage Value under Electric Current Density of 10 mA/cm$^2$)

| | | | Total Pressure | | |
|---|---|---|---|---|---|
| | | | 1.7 Pa | 2.7 Pa | 4.8 Pa |
| Oxygen Partial Pressure | 30% | | ⑫ 500 W (Unmeasured) | ⑬ 500 W (19 V) | Film could not be formed |
| | 50% | | ④ 500 W (19 V) | ⑩ 500 W (19 V) | ⑭ 250 W (13.7 V) |
| | | | | | ② 500 W (13.7 V) |
| | | | | | ⑧ 1000 W (>20 V) |
| | 70% | | ⑪ 500 W (Unmeasured) | ⑤ 250 W (14.7 V) | Film could not be formed |
| | | | | ① 500 W (18.2 V) | |
| | | | | ⑦ 1000 W (>20 V) | |

TABLE 3-continued

Film Forming Conditions and Driving Voltages of the Hole-only Devices 1B
(Applied Voltage Value under Electric Current Density of 10 mA/cm²)

| | Total Pressure | | |
|---|---|---|---|
| | 1.7 Pa | 2.7 Pa | 4.8 Pa |
| 100% | ⑥250 W (Unmeasured)<br>③500 W (>20 V)<br>⑨1000 W (>20 V) | Film could not be formed | Film could not be formed |

*Numbers enclosed in circles indicate device No., numbers without parenthesis indicate input electricity, and numbers placed in parenthesis indicate driving voltage.

Figure 3A:
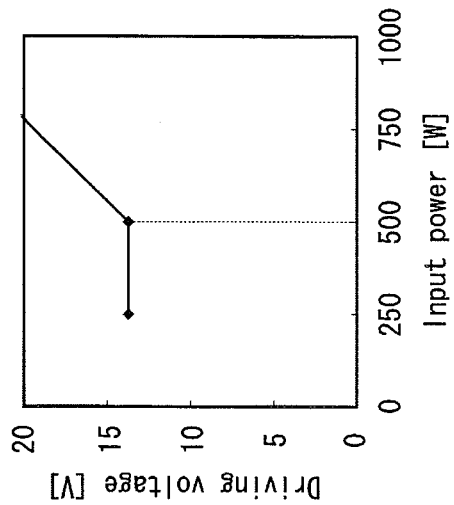
FIGS. 3A through 3C are graphs illustrating a dependence of driving voltage of hole-only devices on film forming conditions of a hole injection layer.
Figure 3B:
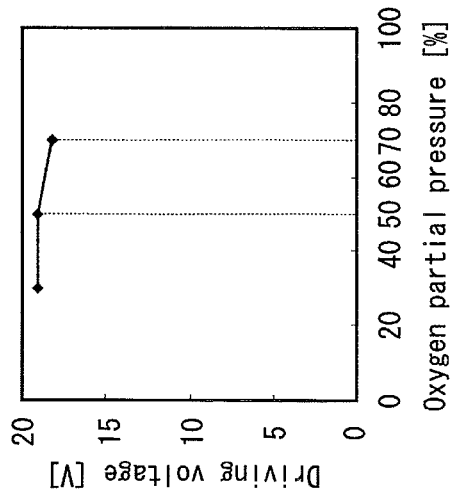
Figure 3C:
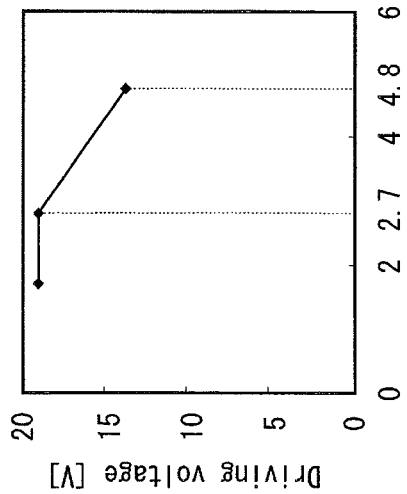

Further, FIGS. 3A through 3C are graphs illustrating the dependence of driving voltages of the hole-only devices 1B on the film forming conditions. Each of the points in FIG. 3A indicate, from left to right in the figure, a driving voltage of the devices No. 4, 10, and 2. Similarly, each of the points in FIG. 3B indicates, from left to right in the figure, a driving voltage of the devices No. 13, 10, and 1. Finally, each of the points in FIG. 3C indicates, from left to right in the figure, a driving voltage of the devices No. 14, 2, and 8.

Here, it should be noted that under the following conditions (i) through (iv), the forming of the hole injection layer 3 was not successfully performed due to limitations of the sputtering device, such as gas flow amount. In specific, the hole injection layer 3 was not formed when: (i) total pressure was 2.7 Pa and oxygen partial pressure ratio was 100%; (ii) total pressure was 4.8 Pa and oxygen partial pressure ratio was 30%; (iii) total pressure was 4.8 Pa and oxygen partial pressure ratio was 70%; and (iv) total pressure was 4.8 Pa and oxygen partial pressure ratio was 100%.

Firstly, concerning the dependence of driving voltage on total pressure, when the oxygen partial pressure ratio was set to 50% and the input power was set to 500 W, a clear reduction in driving voltage was observed when the total pressure was set higher than 2.7 Pa and lower than or equal to 4.8 Pa, as illustrated in FIG. 3A. In addition, as a result of a different experiment, it was found that this trend of reduction in driving voltage continues at least until the total pressure is lower than or equal to 7.0 Pa. Taking this into account, it is preferable that total pressure during the forming of the hole injection layer 3 be set higher than 2.7 Pa and lower than or equal to 7.0 Pa.

Next, concerning the dependence of driving voltage on oxygen partial pressure ratio, when the total pressure was set to 2.7 Pa and the input power was set to 500 W, it was observed that driving voltage decreases as oxygen partial pressure ratio increases, at least when the oxygen partial pressure ratio was set higher than or equal to 50% and lower than or equal to 70%, as illustrated in FIG. 3B. However, as a result of a different experiment, it was found that when the oxygen partial pressure ratio exceeds this range, the driving voltage begins to increase adversely. Taking this into account, it is preferable that oxygen partial pressure ratio during the forming of the hole injection layer 3 be set higher than or equal to 50%, while setting an upper limit at approximately 70%.

Finally, concerning the dependence of driving voltage on input power, when total pressure was set to 4.8 Pa and oxygen partial pressure ratio was set to 50%, a rapid increase in driving voltage was observed when the input power exceeded 500 W, as illustrated in FIG. 3C. Taking this into account, it is preferable that input power be restricted to be lower than or equal to 500 W. Here, it should be noted that, when referring to devices No. 1 and 3 in Table 3, it could be seen that, even when the input power was set to 500 W, driving voltage increased when the total pressure was set lower than or equal to 2.7 Pa.

The subsequent FIG. 4 illustrates an electric current density-applied voltage curve of the hole-only devices 1B, taking devices No. 14, 1, and 7 as examples. In FIG. 4, the vertical axis indicates electric current density (mA/cm²), whereas the horizontal axis indicates applied voltage (V). Furthermore, device No. 14 fulfills all desirable film forming conditions explained in the above of total pressure, oxygen partial pressure, and input power, while on the other hand, each of devices No. 1 and 7 do not fulfill at least one of the desirable film forming conditions.

Concerning the film forming conditions under which the hole injection layer 3 (and the later-described tungsten oxide layer 8) is formed, in order as to facilitate the explanations to be provided in the following, hereinafter, the film forming conditions under which the hole injection layer 3 was formed in element 14 is referred to as film forming conditions A, the film forming conditions under which the hole injection layer 3 was formed in element 1 is referred to as film forming conditions B, and the film forming conditions under which the hole injection layer 3 was formed in element 7 is referred to as film forming conditions C. In addition, devices No. 14, 1, and 7 are respectively illustrated as HOD-A, HOD-B, and HOD-C in FIG. 4 and Table 3.

As illustrated in FIG. 4, the electric current density-applied voltage curve indicating HOD-A indicates that HOD-A has a higher degree of responsiveness to an increase in applied voltage compared with HOD-B and HOD-C. Further, it could be seen that HOD-A requires for the lowest level of applied voltage to reach a high electric current density compared with HOD-B and HOD-C. From this, it is obvious that HOD-A has a higher degree of hole injection efficiency compared with HOD-B and HOD-C. Here, it should be noted that HOD-A operates at the lowest driving voltage among the hole-only devices 1B.

In the above, observation has been made of the hole injection efficiency of the hole injection layer 3 in each of the hole-only devices 1B. However, here it should be emphasized that the hole-only devices 1B and the organic EL element 1 illustrated in FIG. 1 have nearly the same structure, differing only in the cathodes included. Therefore, the dependence of the hole injection efficiency from the hole injection layer 3 to the buffer layer 4 on the film forming conditions under which the hole injection layer 3 is formed is basically the same in the organic EL element 1 and in the hole-only devices 1B. In order as to confirm the existence of such a similar dependence on the film forming conditions under which the hole injection layer 3 is formed, the inventors prepared three separate organic EL elements 1, each having a hole injection layer 3 formed under a corresponding one of film forming conditions A, film forming conditions B, and film forming conditions C.

More specifically, the inventors prepared the organic EL elements 1 illustrated in FIG. 1 by forming the 50 nm-thick anode 2 composed of an ITO thin film on the substrate 10, and further disposing, one the anode 2 so formed, the following layers in the order in which they are introduced: a 30 nm-thick hole injection layer 3 composed of tungsten oxide; a 20 nm-thick buffer layer 4 composed of TFB, which is an organic amine-containing polymer; a 70 nm-thick light-emitting layer 5 composed of F8BT, which is an organic polymer; and the cathode 9 composed of a 5 nm-thick barium layer and a 100 nm-thick aluminum layer. Note that, considering that the organic EL elements 1 are assessment devices, the banks 12 were omitted from the structure thereof.

Figure 5:
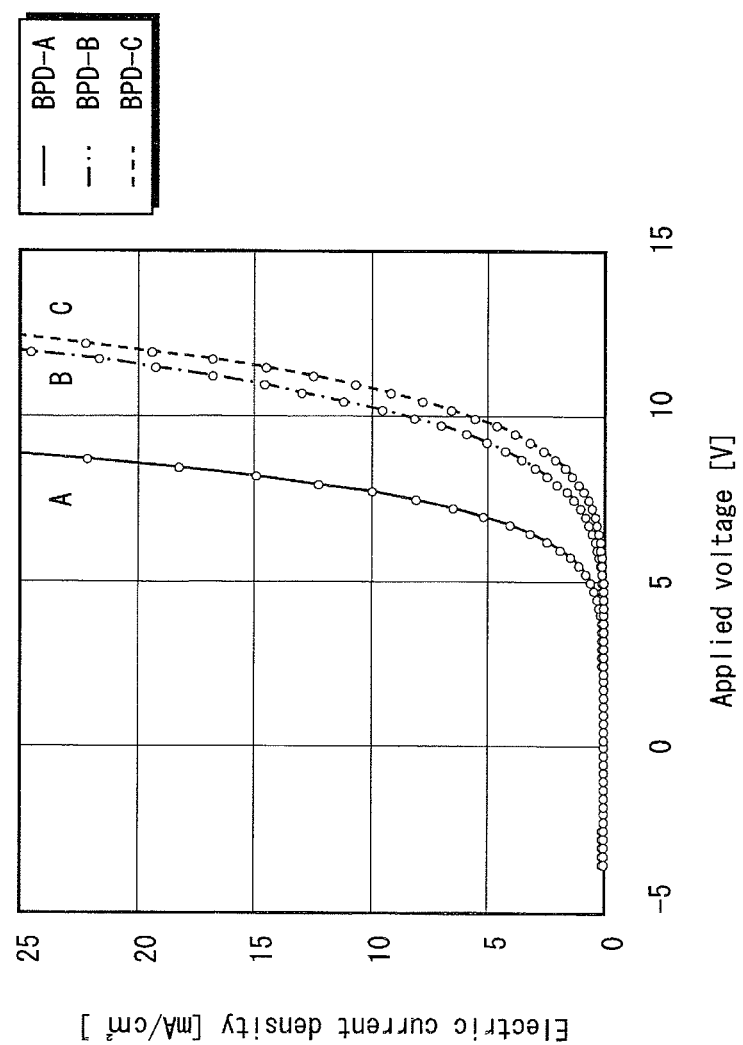
FIG. 5 is a device characteristics diagram showing a relation curve illustrating a relation between applied voltage and electric current density of organic EL elements prepared by the inventors.

The inventors connected the organic EL devices 1 prepared under the corresponding one of the film forming conditions A, B, and C to a direct current power supply 11, and applied voltage thereto. FIG. 5 illustrates an electric current density-applied voltage curve indicating the relation between the electric current density value and the applied voltage. More specifically, the inventors obtained an electric current value per unit surface area (electric current density) for each of the organic EL elements 1 by changing the voltage applied to the organic EL elements 1, obtaining a value indicating electric current flowing at different voltages, and converting the electric current value into the electric current density value. In FIG. 5, the vertical axis indicates electric current density ($mA/cm^2$), whereas the horizontal axis indicates applied voltage (V).

Note that, in order as to facilitate the explanations to be made in the following, the organic El elements 1 prepared under film forming conditions A, B, and C are respectively illustrated as BPD-A, BPD-B, and BPD-C in FIG. 5.

As illustrated in FIG. 5, the electric current density-applied voltage curve indicating BPD-A indicates that HOD-A has a higher degree of responsiveness to an increase in applied voltage compared with BPD-B and BPD-C. Further, it could be seen that BPD-A requires for the lowest level of applied voltage to reach a high electric current density compared with BPD-B and BPD-C. This trend is similar to the trend which could be seen in the hole-only devices HOD-A, HOD-B, and HOD-C, which were prepared under the same respective film forming conditions as BPD-A, BPD-B, and BPD-C.

Figure 6:
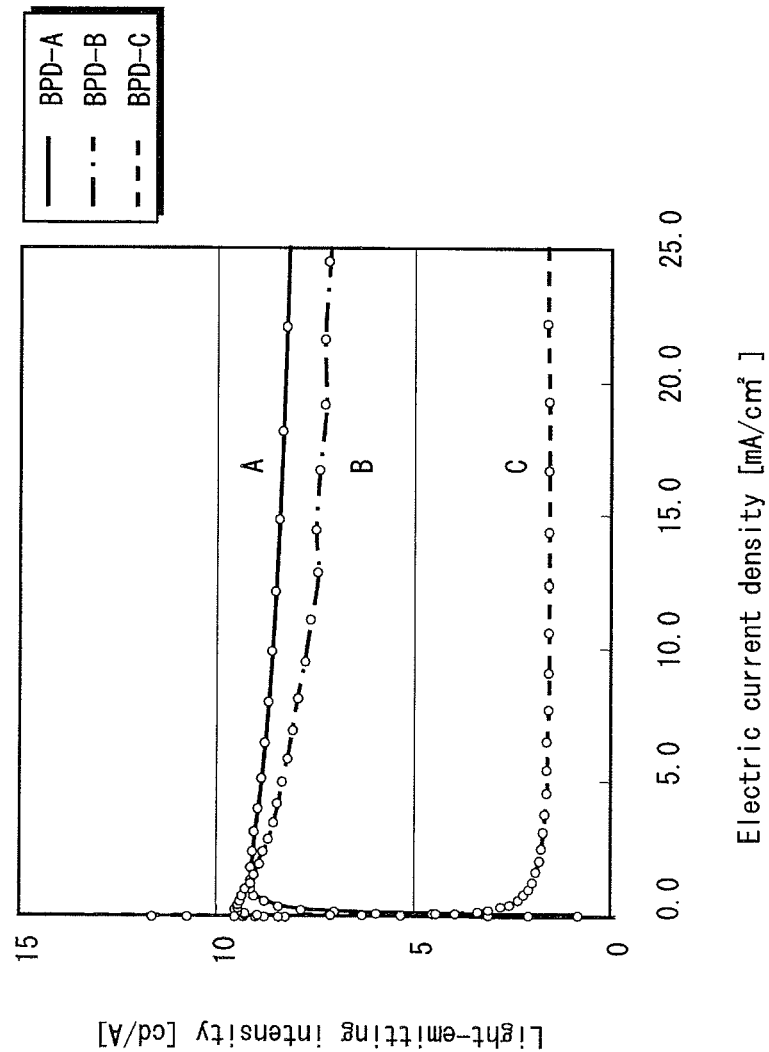
FIG. 6 is a device characteristics diagram showing a relation curve illustrating a relation between electric current density and light-emitting intensity of the organic EL elements prepared by the inventors.

In addition, FIG. 6 illustrates light-emitting intensity-electric current density curves corresponding to the organic EL elements 1 prepared in the above. Each light-emitting intensity-electric current density curve indicates the relation between the change in electric current density and the resultant change in light-emitting intensity of the corresponding organic EL element 1. In FIG. 6, the vertical axis indicates light-emitting intensity (cd/A), whereas the horizontal axis indicates electric current density ($mA/cm^2$). According to FIG. 6, it can be seen that BPD-A has the highest light-emitting intensity among the three organic EL elements 1, at least within the range of electric current density that was measured in the experiment.

From the above results, it was confirmed that, concerning the organic EL elements 1, the hole injection efficiency of the hole injection layer 3 depends on the film forming conditions, similar as in the case of the hole-only devices 1B. That is, when forming the tungsten oxide film composing the hole injection layer 3 by using metal tungsten as the sputtering target in a DC magnetron sputtering device by applying the reactive sputtering method while no control is performed with respect to substrate temperature and the chamber gas used is composed of argon gas and oxygen gas, a hole injection layer having the highest hole injection efficiency with respect to the buffer layer 4 was produced under film forming conditions where: (i) total pressure is higher than 2.7 Pa and lower than or equal to 7.0 Pa; (ii) oxygen partial pressure ratio is higher than or equal to 50% and lower than or equal to 70%; and (iii) input power density is higher than or equal to 1 $W/cm^2$ and lower than or equal to 2.8 $W/cm^2$. Thus, it was confirmed that a hole injection layer 3 formed while fulfilling such exemplary film forming conditions (i), (ii), and (iii) realizes both low voltage drive and high light-emitting efficiency.

Note that in the above, the film forming condition (iii) concerning input power is indicated in terms of input power density by referring to Table 2. In addition, when using a DC magnetron sputtering device that is different from the DC magnetron sputtering device used in the present experiment, a hole injection layer 3 composed of tungsten oxide having a high hole injection efficiency can be similarly yielded by adjusting input power according to the size of the sputtering target. The adjustment of input power should be performed such that the input power density fulfills condition (iii) above. Concerning the other conditions (i) and (ii), total pressure and oxygen partial pressure should each be set within the above-provided range, regardless of the device to be used and the size of the sputtering target.

Additionally, as already explained in the above, no intentional adjustment of the substrate temperature was performed while forming the hole injection layer 3 by applying the reactive sputtering method. And during the experiment, the sputtering device was placed under room temperature. Therefore, the substrate was at room temperature at least before the forming of the hole injection layer 3 was performed. However, while forming of the hole injection layer 3 is being performed, there is a possibility that the substrate temperature may rise by several tens of degrees Celsius.

Furthermore, the organic EL element 1 having the hole injection layer 3 formed under film forming conditions A corresponds to the organic EL element 1 in the embodiment of the present invention, which has the occupied energy level near the Fermi surface. Detailed observation is to be made regarding this point in the following.

(Electronic State of the Hole Injection Layer)

The tungsten oxide composing the hole injection layer 3 of the organic EL element 1 pertaining to the embodiment of the present invention has the occupied energy level near the Fermi surface. The occupied energy level near the Fermi surface is formed by adjusting the film forming conditions under which the hole injection layer 3 is formed as description has been provided in the above. Details concerning this point are provided in the following.

The inventors conducted an experiment to determine whether the occupied energy level near the Fermi surface exists in each of the tungsten oxide films formed under a corresponding one of film forming conditions A, B, and C.

Figure 7:
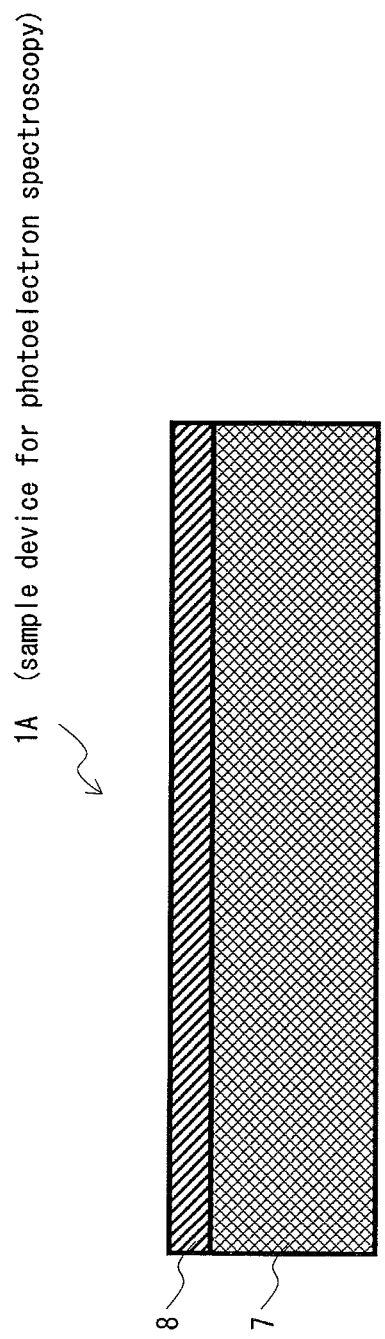
FIG. 7 is a schematic cross-sectional view illustrating a structure of a sample device which is used for photoelectron spectroscopy measurement.

The inventors prepared sample devices to be subjected to photoelectron spectroscopy measurement. Each of the sample devices were prepared under a corresponding one of the film forming conditions A, B, and C. In detail, each of the sample devices were prepared by forming a 10 nm-thick tungsten oxide layer (corresponding to the hole injection layer 3) on a conductive silicon substrate 7 by applying the reactive sputtering method as described in the above. 1A in FIG. 7 indicates a sample device having such a structure. So as to facilitate explanation provided in the following, a sample device 1A formed under film forming conditions A is hereinafter referred to as sample device A, a sample device 1A formed under film forming conditions B is hereinafter referred to as sample device B, and a sample device 1A formed under film forming conditions C is hereinafter referred to as sample device C.

The forming of the tungsten oxide layer 8 of each of the sample devices was performed inside a sputtering device. Then, to prevent atmospheric exposure, the sample devices A, B, and C were transported to a glovebox which was connected to the sputtering device and which was filled with nitrogen gas. Subsequently, the sample devices were sealed inside transfer vessels in the glovebox, and were mounted on a photoelectron spectroscopy device. Thus, ultraviolet photoelectron spectroscopy (UPS) measurement of the sample devices was performed while preventing the tungsten oxide layer 8 having been formed on the sample devices from undergoing atmospheric exposure.

In general, a UPS spectrum obtained as a result of the UPS measurement reflects a state of occupied energy levels, such as a valence band and the like, within several nanometers in distance from the surface of the target of measurement. As such, the present experiment was conducted in order as to observe the state of occupied energy levels at a surface portion of the tungsten oxide layer 8 by utilizing UPS measurement.

The conditions under which the UPS measurement was conducted are as follows. Here, it should be noted that, since the sample devices A, B, and C commonly include the conductive silicon substrate 7, charge-up did not occur during the UPS measurement. Further, the interval between measurement points was set to 0.05 eV.

Figure 8:
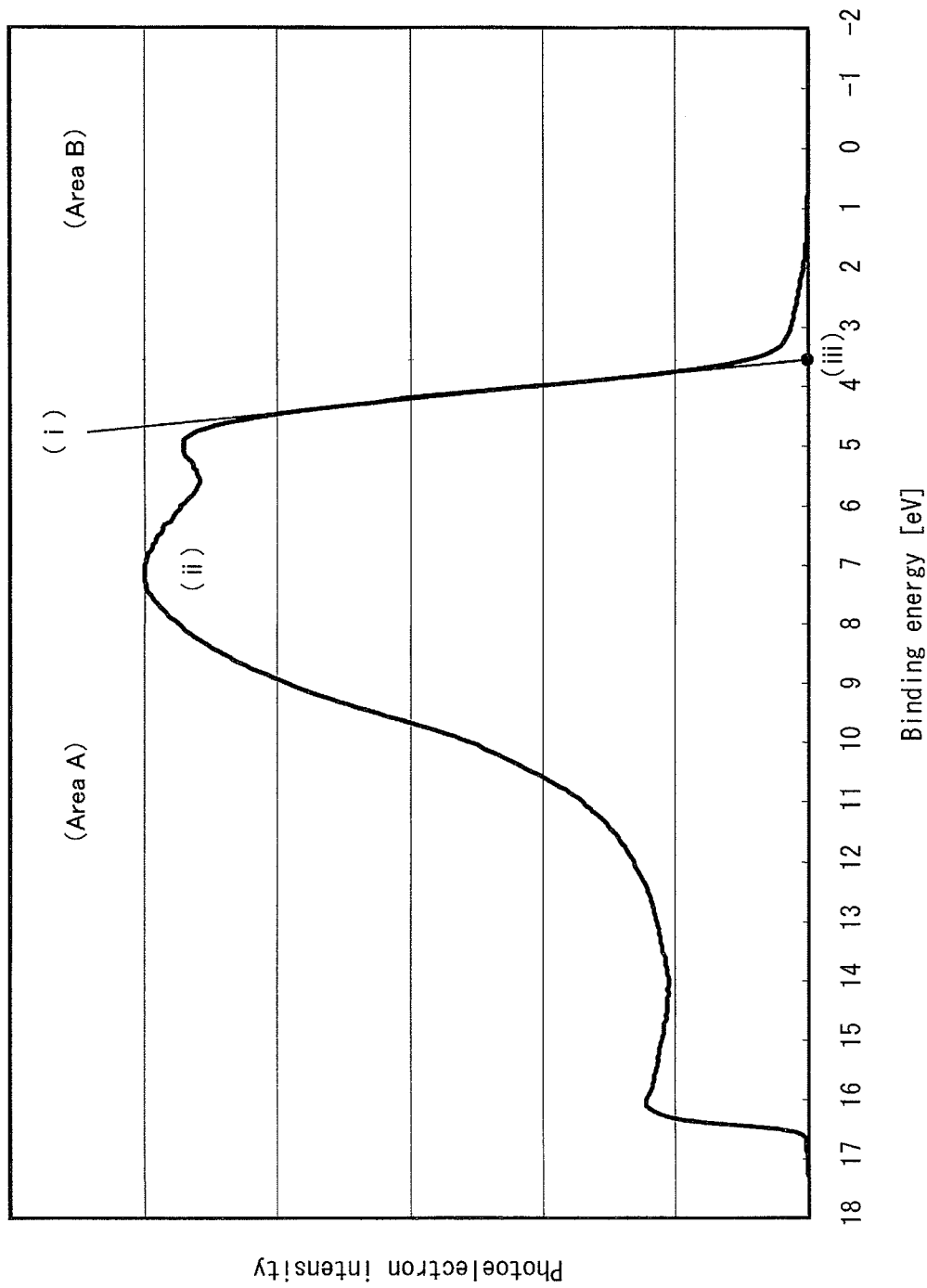
FIG. 8 illustrates a UPS spectrum of tungsten oxide.

Light source: He I line
Bias: None
Electron emission angle: Normal line direction of the substrate surface FIG. 8 illustrates a UPS spectrum of the tungsten oxide layer 8 of the sample device A. In FIG. 8, the horizontal axis indicates binding energy. The reference point on the horizontal axis corresponds to the Fermi surface of the substrate 7, and the left direction with respect to the reference point is positive, and the right direction with respect to the reference point is negative.

In the following, description is provided on each of the occupied energy levels of the tungsten oxide layer 8 with reference to FIG. 8.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area A that extends in the high binding energy direction departing from point (iii); and area B that extends in the low binding energy direction (that is, to the direction of the Fermi surface) departing from point (iii).

Here, according to Table 4, each of the sample devices A, B, and C has a tungsten oxide layer 8 whose composition ratio between tungsten atoms and oxygen atoms is approximately 1:3. The composition ratios illustrated in Table 4 were obtained by performing X-ray photoelectron spectroscopy (XPS) measurement with respect to each of the sample devices A, B, and C. More specifically, XPS measurement of the sample devices was performed by using the photoelectron spectroscopy device while preventing atmospheric exposure of the tungsten oxide layer 8 having been formed on the sample devices, in a similar way as in the conduction of the UPS measurement. By conducting the XPS measurement, the composition ratio between tungsten and oxygen within several nanometers in distance from the surface of the tungsten oxide layer 8 was estimated for each of the sample devices A, B, and C. Note that the film forming conditions under which the tungsten oxide layer 8 in each of the corresponding sample devices were formed are also illustrated in Table 4.

TABLE 4

| Sample Device | Sample Device A | Sample Device B | Sample Device C |
|---|---|---|---|
| Film Forming Conditions | Film Forming Conditions A | Film Forming Conditions B | Film Forming Conditions C |
| Total Pressure (Pa) | 4.8 | 2.7 | 2.7 |
| Oxygen Partial Pressure (%) | 50 | 70 | 70 |
| Input Power (W) | 250 | 500 | 1000 |
| Composition Ratio (Oxygen/Tungsten) | 3.0 | 2.9 | 2.8 |

According to the composition ratios obtained as a result of the XPS measurement, it could be assumed that in each of the sample devices A, B, and C, the tungsten oxide layer 8, at least within several nanometers in distance from the surface thereof, has a basic atomic arrangement which is in accordance with the atomic arrangement of tungsten trioxide. That is, the basic structure of the tungsten oxide layer 8 is assumed as being a structure where oxygen atoms are bound to a tungsten atom to form an octahedral coordination, and these octahedrons share oxygen atoms at corners thereof with adjacent octahedrons. Taking this into account, the area A in FIG. 8 indicates an occupied energy level deriving from the basic structure of the tungsten oxide layer 8 as mentioned in the above, which is the structure of the crystalline phase of tungsten trioxide or of a non-crystalline phase of tungsten trioxide, which lacks the order characteristic of the crystalline phase (note that the bond between atoms is maintained in the non-crystalline phase, and therefore the above-mentioned basic structure is preserved). Thus, the area A in FIG. 8 corresponds to a so-called valence band of the tungsten oxide layer 8. Note that the inventors of the present invention have performed X-ray absorption fine structure (XAFS) measurement with respect to the tungsten oxide layer 8 of each of the sample devices A, B, and C, and have confirmed that the above-mentioned basic structure is formed therein.

Accordingly, the area B in FIG. 8 corresponds to the band gap between the valence band and the conductive band of the tungsten oxide layer 8. Further, it is commonly known that an occupied energy level that differs from the occupied energy level of the valence band may exist in the area B of the tungsten oxide, as is suggested by the UPS spectrum in FIG. 8. The occupied energy level in area B derives from another structure that is different from the above-mentioned basic structure, and is referred to as a so-called band gap (in-gap state or gap state) energy level.

Figure 9:
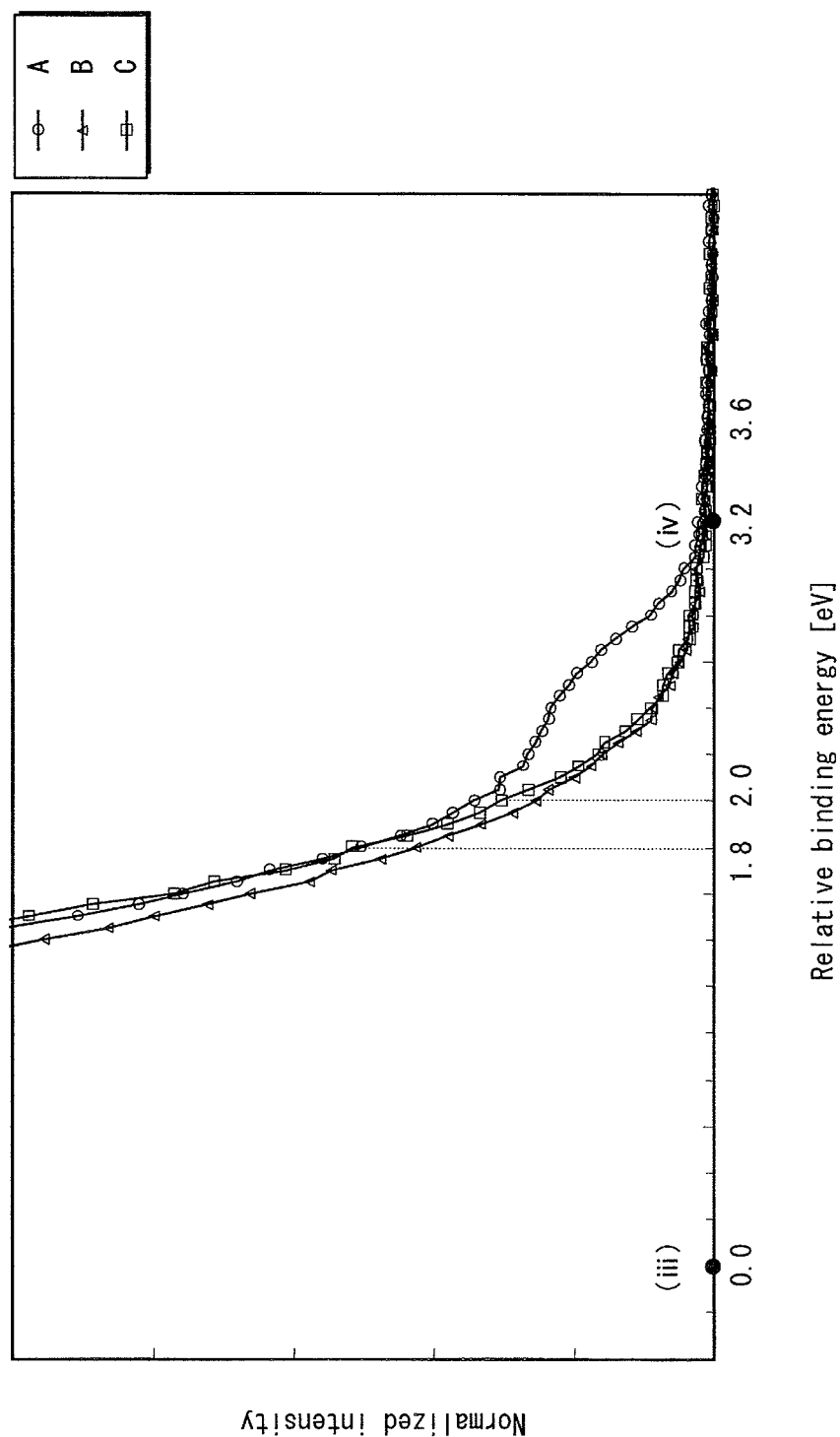
FIG. 9 illustrates UPS spectra of tungsten oxide.

The subsequent FIG. 9 illustrates a UPS spectrum of the tungsten oxide layer 8 of each of the sample devices A, B, and C, particularly within area B in FIG. 8. The spectrum intensity indicated by the vertical axis in FIG. 9 has been normalized using the peak-top intensity value of a peak (ii) in FIG. 8, which is located approximately 3 eV to 4 eV to the high binding energy direction from point (iii). In addition, note that point (iii) in FIG. 9 is illustrated at the same point on the horizontal axis as in FIG. 8. In FIG. 9, the horizontal axis indicates a relative value (relative binding energy) with respect to point (iii), and the binding energy decreases as the relative binding energy increases. That is, a point that is further to the right of point (iii) (or closer to the side of the Fermi surface) has a lower binding energy compared to a point which is closer to point (iii).

As illustrated in FIG. 9, the spectrum indicating the tungsten oxide layer 8 of the sample device A exhibits a peak in an area between a point which is 3.6 eV lower in terms of binding energy than point (iii) and a point which is 1.8 eV lower in terms of binding energy than point (iii). Point (iv) in FIG. 9 indicates a point at which such a peak in the spectrum indicating the tungsten oxide layer 8 of the sample device A is first obviously observed. That is, point (iv) is a point at which the peak begins. The existence of such a peak is not observed in the spectra corresponding to sample devices B and C.

The present invention uses, for forming the hole injection layer, tungsten oxide whose UPS spectrum indicates an upward protrusion (not necessarily a peak) in an area which is 1.8 eV to 3.6 eV lower in terms of binding energy than point (iii). Hence, the organic EL element of the present invention exhibits excellent hole injection efficiency.

Furthermore, it has been found that hole injection efficiency is enhanced to a greater extent when the upward protrusion exhibited in the UPS spectrum of the tungsten oxide layer 8 has a higher degree of sharpness. Therefore, it can be said that the area of the UPS spectrum which is between a point 2.0 eV lower than point (iii) and another point 3.2 eV lower than point (iii), in terms of binding energy, is particularly essential, since the upward protrusion is more prominent and has a sharper inclination compared to other areas of the UPS spectrum.

Note that, in the following description, the upward protrusion as observed in the UPS spectrum of the tungsten oxide layer 8 is referred to as "a spectral protrusion near the Fermi surface". Furthermore, the energy level corresponding to this spectral protrusion near the Fermi surface is the "the occupied energy level near the Fermi surface", which has been already described in the above.

Subsequently, the inventors performed differentiation on the normalized intensity of the UPS spectrum of each of the sample devices A, B, and C indicated in FIG. 9. The differentiation was performed for the purpose of making the spectral protrusion near the Fermi surface more distinguishable.

In specific, by using the graph analysis software IGOR Pro 6.0, binomial smoothing (where smoothing factor was set to 1) was conducted eleven times with respect to the UPS spectra illustrated in FIG. 9, and differentiation was subsequently performed applying the central difference method. Such processing of data was conducted so as to remove fluctuation factors such as background noise generated during the UPS measurement, to smoothen the differential curves, and to convey the arguments presented in the following in a clear manner as possible.

Figure 10:
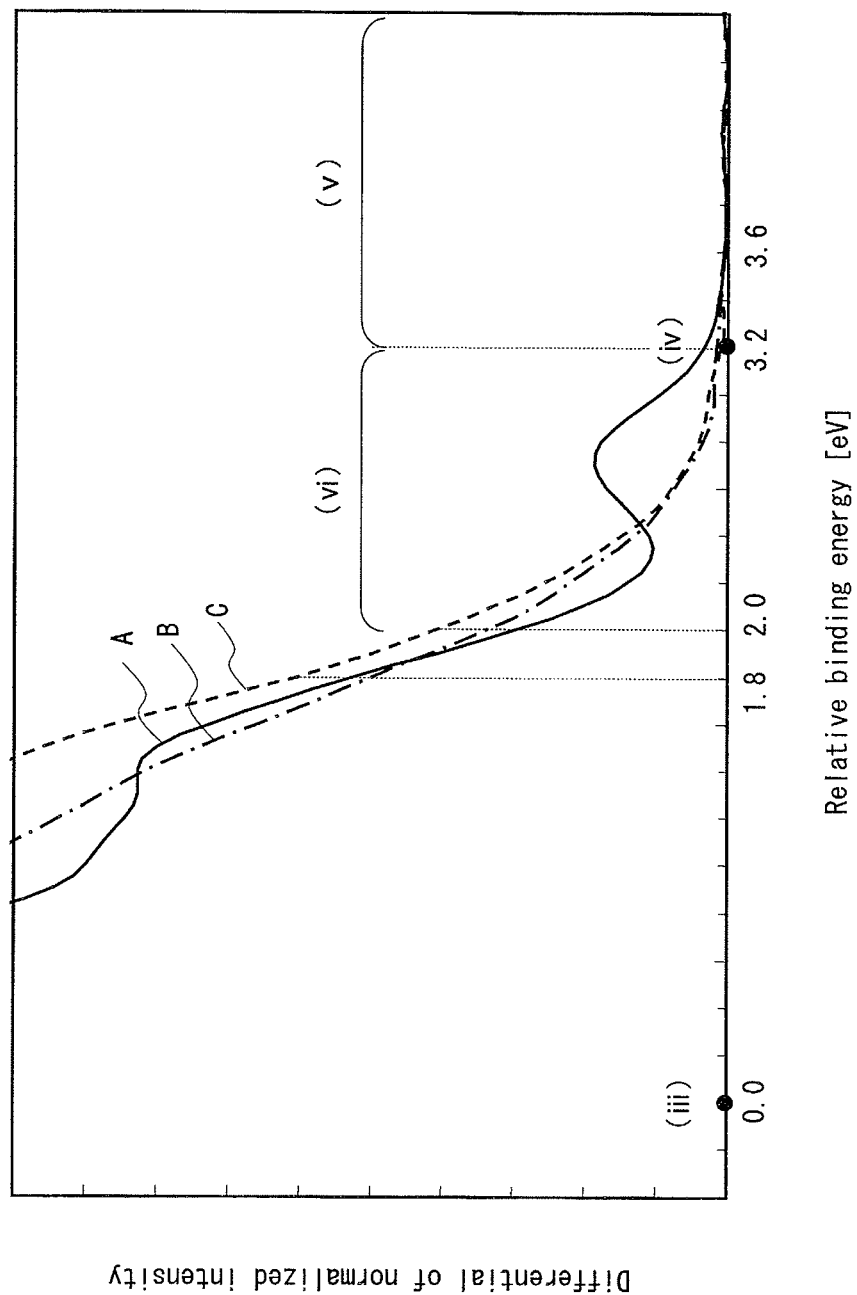
FIG. 10 illustrates differential curves corresponding to the respective UPS spectra illustrated in FIG. 9.

FIG. 10 illustrates differential curves yielded as a result of the above processing. Points (iii) and (iv) in FIG. 10 are provided at the same points on the horizontal axis as the respective points (iii) and (iv) in FIG. 9.

According to the differential curves illustrated in FIG. 10, the derivatives of normalized intensities of the tungsten oxide layers 8 corresponding to sample devices B and C do not depart from the vicinity of "0" within an area (v). Area (v) indicates an area which extends from a point which indicates a minimal binding energy that can be measured by using the photoelectron spectroscopy device to point (iv). Furthermore, in an area (vi) extending approximately 1.2 eV in the high binding energy direction from point (iv), the derivatives corresponding to sample devices B and C exhibit only a slight increase as approaching the high binding energy direction, although increase is seen in the increase rates thereof. In addition, the shapes of the differential curves corresponding to sample devices B and C within areas (v) and (vi) turn out to exhibit similarity with the respective UPS spectra illustrated in FIG. 9, from which the differential curves of FIG. 10 have been derived. Therefore, it can be said that the shapes of the UPS spectrum and the differential curve derived therefrom of each of sample devices B and C within areas (v) and (vi) resemble the shape of an exponential function curve.

Contrariwise, the differential curve corresponding to the tungsten oxide layer 8 of the sample device A in FIG. 10 exhibits a rapid rise from the vicinity of point (iv) towards the direction of point (iii). Thus, the shape of the differential curve corresponding to the tungsten oxide layer 8 of the sample device A within the areas (v) and (vi) clearly differs from the shape of an exponential function curve. Similarly, in FIG. 9, the spectrum corresponding to the tungsten oxide layer 8 of the sample device A, from which the differential curve in FIG. 10 corresponding to sample device A is derived, begins to protrude in the vicinity of point (iv). At the same time, it could also be seen that the spectrum in FIG. 9 exhibits a spectral protrusion near the Fermi surface, which is not found in a spectrum having the shape of an exponential function curve. In other words, such a sample device A is characterized in that an occupied energy level near the Fermi surface is found in an area which is approximately 1.8 eV to 3.6 eV lower than the lowest energy level of a valence band of the hole injection layer, in terms of binding energy. More specifically, a spectral protrusion near the Fermi surface corresponding to the occupied energy level near the Fermi surface can be clearly seen in an area between a point which is approximately 2.0 eV lower than the lowest energy level of the valence band and another point which is approximately 3.2 eV lower than the lowest energy level of the valence band, in terms of binding energy, in the UPS spectrum corresponding to the sample device A.

Figure 11:
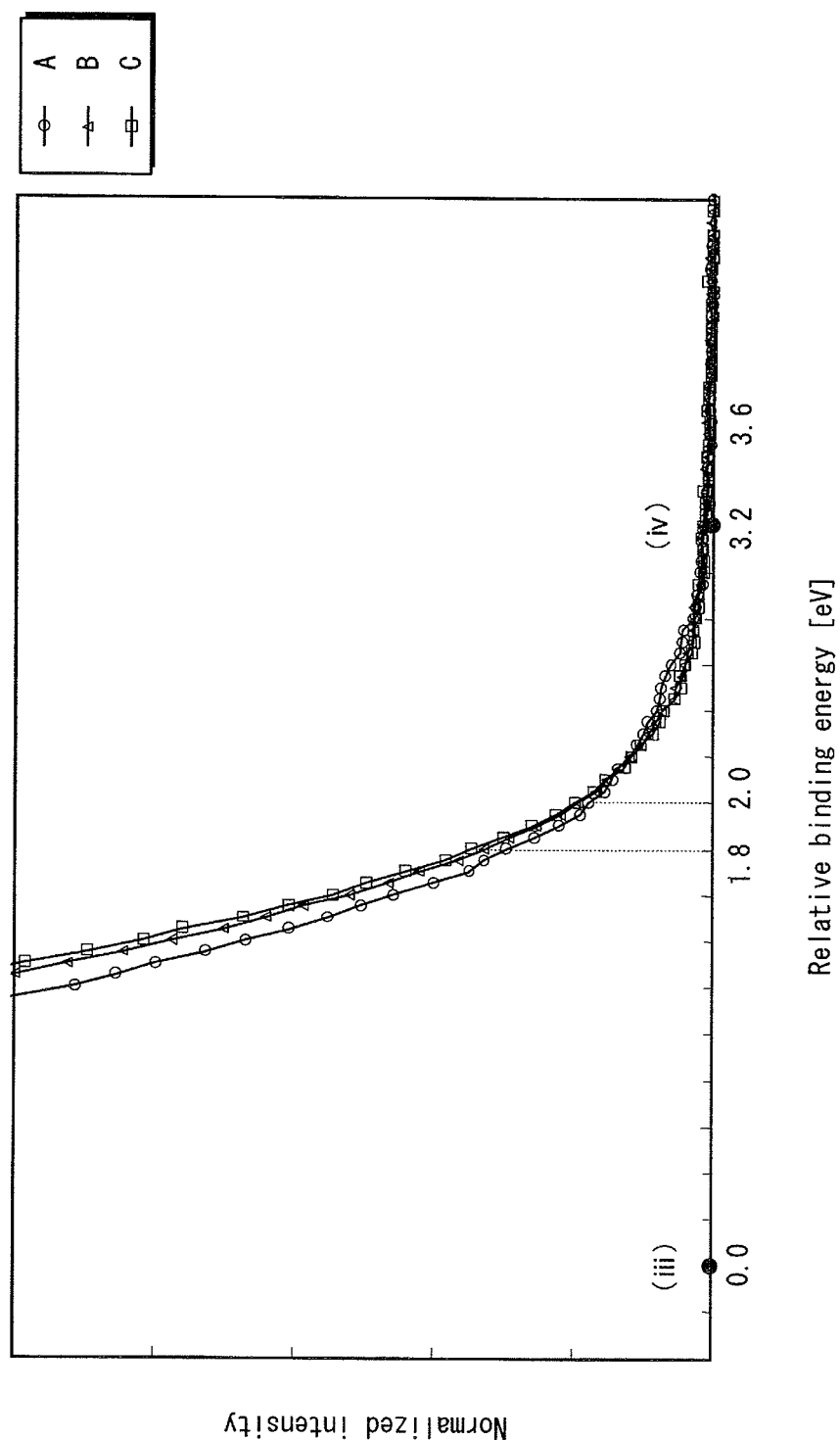
FIG. 11 illustrates UPS spectra of tungsten oxide that has been subjected to atmospheric exposure.

Next, the inventors conducted atmospheric exposure of the tungsten oxide layer 8 of each of the sample devices A, B, and C for a period of one hour. Note that the sample devices A, B, and C are the same sample devices as used in conducting the UPS measurement to obtain the UPS spectra in FIG. 9, and therefore have not been exposed to the atmosphere since the forming of the tungsten oxide layer 8. Following atmospheric exposure, the inventors conducted UPS measurement once again with respect to the tungsten oxide layer 8 of each of the sample devices A, B, and C. Observation was conducted focusing on the changes in the UPS spectrum corresponding to each of the sample devices A, B, and C. FIG. 11 illustrates UPS spectra which correspond to the sample devices A, B, and C within the area B in FIG. 8. The horizontal axis in FIG. 11 is similar to the horizontal axis in FIG. 9, and points (iii) and (iv) in FIG. 11 are provided at the same points on the horizontal axis as the respective points (iii) and (iv) in FIG. 9.

According to the UPS spectra illustrated in FIG. 11, the tungsten oxide layer 8 of each of the sample devices B and C do not exhibit the spectral protrusion near the Fermi surface. Thus, it has been seen that the UPS spectra corresponding to the sample devices B and C do not exhibit the spectral protrusion both before or after atmospheric exposure. Contrariwise, it can be seen that the tungsten oxide layer 8 of the sample device A still exhibits the spectral protrusion near the Fermi surface, although the spectrum differs in intensity and shape when compared to before atmospheric exposure. Hence, it is observed that the tungsten oxide layer 8 of the sample device A maintains the same characteristics as before atmospheric exposure, even after conducting exposure thereof to the atmosphere for a certain period of time. Therefore, it can be concluded that the tungsten oxide layer 8 of the sample device A has a certain level of stability with respect to ambient atmosphere.

In the above, description has been provided regarding the sample devices A, B, and C with focus on the respective UPS spectra obtained as a result of UPS measurement. However, it should be noted that the existence of the spectral protrusion near the Fermi surface is to be similarly observed when applying an XPS measurement or a hard X-ray photoemission spectroscopy measurement.

Figure 12:
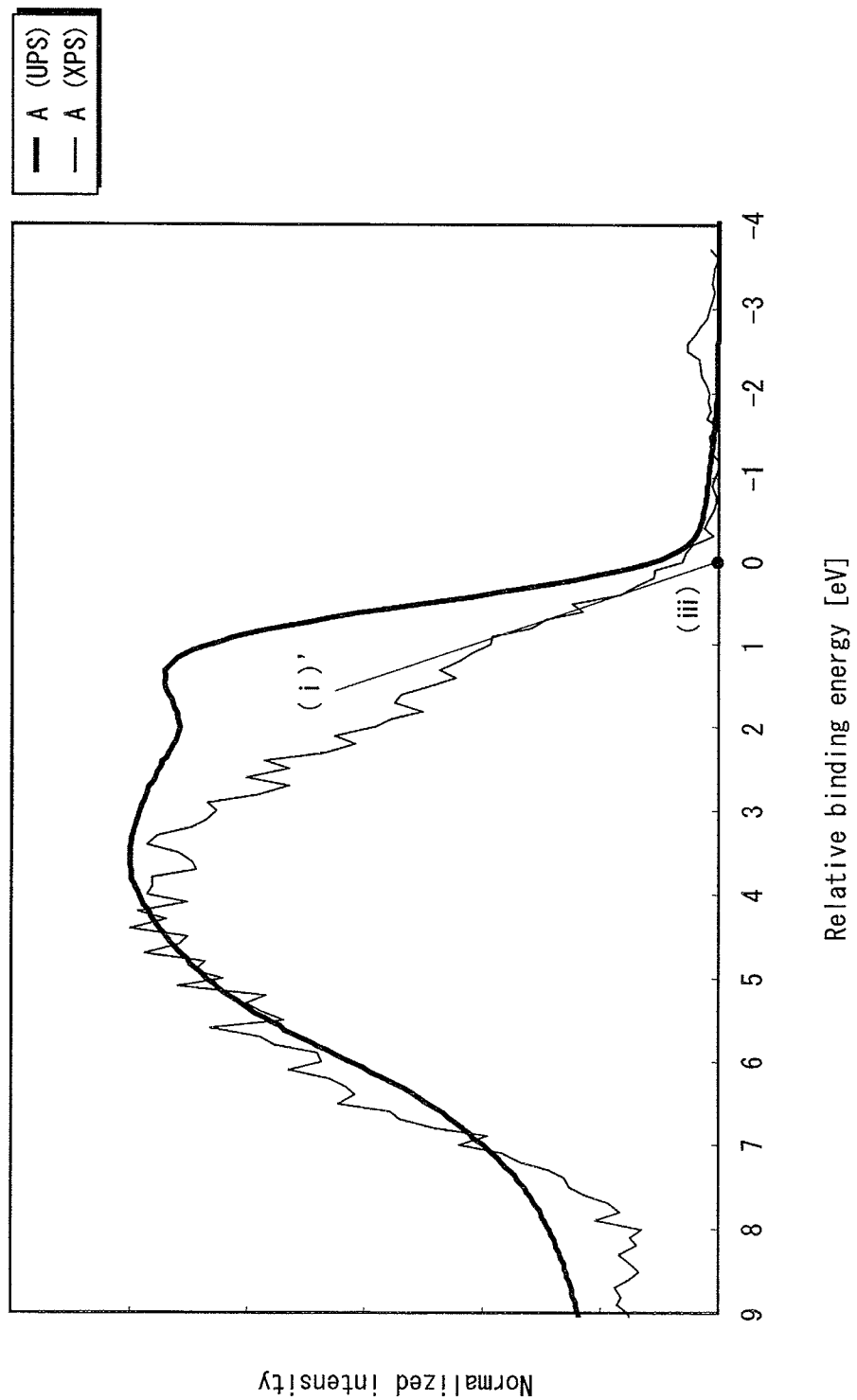
FIG. 12 illustrates both a UPS spectrum and an XPS spectrum of tungsten oxide pertaining to the present invention.

FIG. 12 illustrates an XPS spectrum of the tungsten oxide layer 8 of the sample device A after atmospheric exposure thereof. Note that, in FIG. 12, the XPS spectrum is overlaid with a UPS spectrum of the tungsten oxide layer 8 of the sample device A (the same UPS spectrum as illustrated in FIG. 8), so as to enable comparison between the two spectra.

The conditions under which the XPS measurement was conducted are similar to the conditions under which the UPS measurement was conducted as already described in the above, differing only in that an Al—K alpha line was used as the light source. In FIG. 12, point (iii) is provided at the same point on the horizontal axis as point (iii) in FIG. 8, and further, the horizontal axis indicates a relative binding energy with respect to point (iii). In addition, a line in the XPS spectrum corresponding to the line (i) in FIG. 8 is illustrated as line (i)' in FIG. 12.

As illustrated in FIG. 12, the spectral protrusion near the Fermi surface of the tungsten oxide layer 8 of the sample device A is found in the XPS spectrum, as well as in the UPS spectrum. In detail, in the XPS spectrum of the tungsten oxide layer 8 of the sample device A, the spectral protrusion near the Fermi surface is exhibited as a protrusion of a considerable degree within an area between a point which is approximately 1.8 eV lower than the lowest energy level of a valence band of the hole injection layer and another point which is 3.6 eV lower than the lowest energy level of the valence band of the hole injection layer, in terms of binding energy. Further, the spectral protrusion near the Fermi surface was similarly found when a hard X-ray photoemission spectroscopy measurement was conducted.

In the above, the sample device 1A (illustrated in FIG. 7) was used, instead of the organic EL element 1 which is illustrated in FIG. 1, as the sample device for conducting the photoelectron spectroscopy measurements. The sample device 1A has a structure which differs from the organic EL element 1, and is formed by disposing a tungsten oxide layer 8 on the conductive silicon substrate 7. Here, it should be noted that this measure has been taken merely for the sake of preventing the occurrence of charge-up, and thus, the structure of the organic EL element pertaining to the present invention is not to be limited thereby.

According to another experiment conducted by the inventors of the present invention, when UPS measurement and XPS measurement were conducted against a sample device having the structure of the organic EL element as illustrated in FIG. 1 (the structure where the anode 2 composed of ITO and the hole injection layer 3 composed of tungsten oxide are formed in the stated order on one surface of the substrate 10), the occurrence of charge-up was encountered during the measurements.

However, by using a neutralizing electron gun in such measurements, the occurrence of charge-up can be inhibited. When the neutralizing electron gun was used, there were cases where the absolute value of the binding energy indicated by each of the occupied energy levels of the hole injection layer 3 (for instance, the binding energy value when the Fermi surface of the photoelectron spectroscopy device itself is determined as the reference point) differed from the corresponding value of the tungsten oxide layer 8 of the sample device 1A. However, a spectrum having a similar shape as the spectrum of the sample device 1A was obtained, at least within an area extending from the band gap energy level to the lowest energy level of the valence band, in terms of binding energy.

(Analysis Concerning Hole Injection Efficiency)

The principle of the effect that the existence of the occupied energy level near the Fermi surface in the hole injection layer composed of tungsten oxide has on hole injection efficiency can be explained as provided in the following. Note that the existence of the occupied energy level near the Fermi surface is to be observed as a spectral protrusion near the Fermi surface in, for instance, a UPS spectrum of the hole injection layer.

It has been frequently reported, with reference to results of experiments and first principles calculations, that existence of the occupied energy level near the Fermi surface, which can be seen in a thin film or a crystal of tungsten oxide, derives from oxygen vacancy or a structure similar thereto.

More specifically, assumption has been made that the existence of the occupied energy level near the Fermi surface derives from a binding orbital formed by 5d orbitals of adjacent tungsten atoms or from a 5d orbital of a singular tungsten atom which is not terminated with an oxygen atom and which exists at the surface of a film or within a film. Further, it is assumed that such 5d orbitals, when either in semi-occupied state or unoccupied state, are capable of pulling an electron off of the highest occupied molecular orbital of an organic molecule when contact is formed therebetween. The pulling of an electron from the organic molecule performed by the 5d orbital is believed to have the effect of stabilizing the energy state of both the tungsten atom and the organic molecule.

As a matter of fact, a report has been made that, when a layer composed of α-NPD, which is a small organic molecule, is layered on a thin film of molybdenum oxide, electrons transfer from the α-NPD molecule to the molybdenum oxide thin film (Non-Patent Literature 2). Here, explanation is provided concerning molybdenum oxide since molybdenum oxide has many common physical properties similar to those of tungsten oxide, such as a catalyst effect, electrochromism, and photochromism.

Further in detail, the inventors of the present invention have arrived at the conception that, in the case of tungsten oxide, a semi-occupied 5d orbital or a structure similar thereto of a single tungsten atom corresponds to the occupied energy level near the Fermi surface. The semi-occupied 5d orbital is lower in terms of binding energy than a binding orbital of 5d orbitals of adjacent tungsten atoms.

Figure 13:
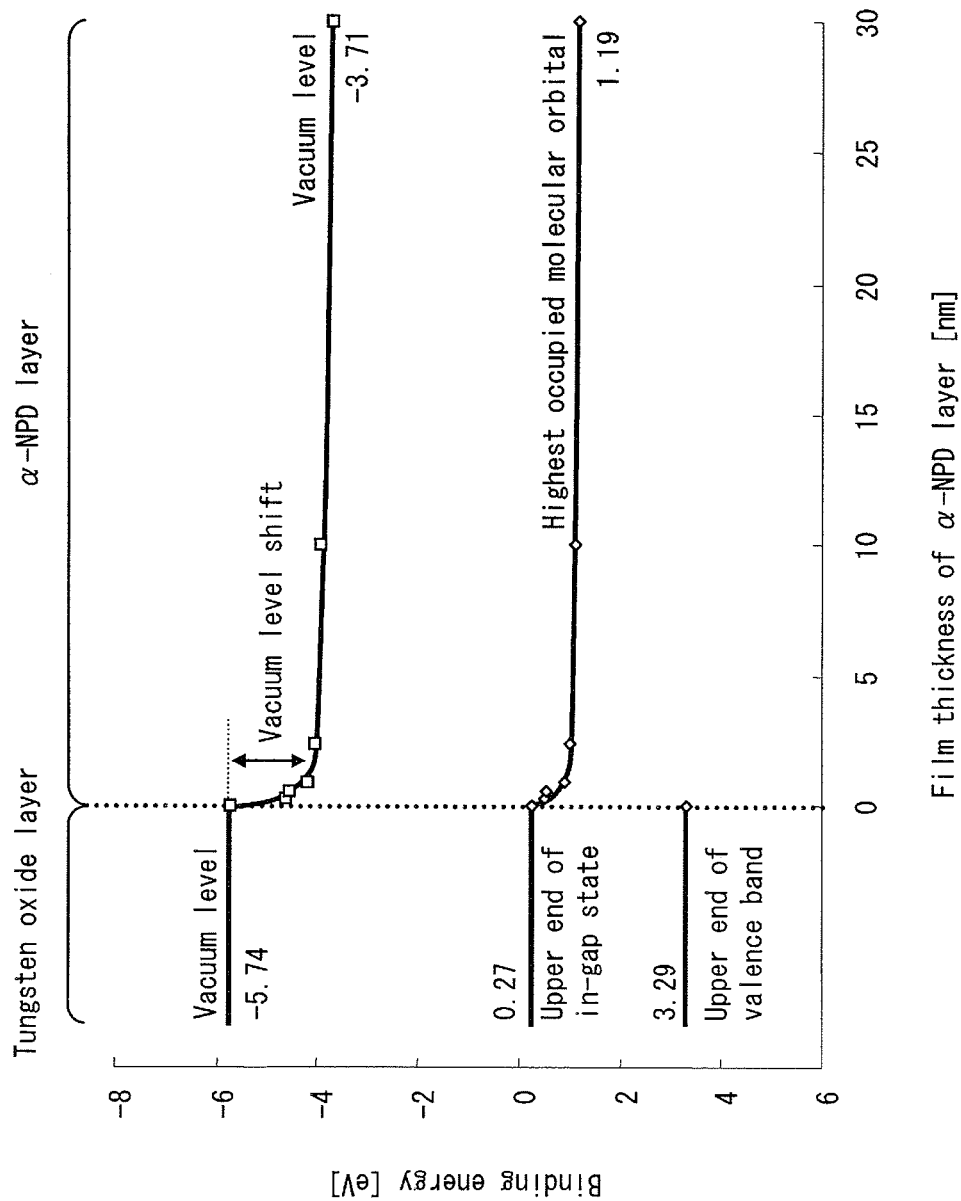
FIG. 13 is a diagram illustrating an energetic state at an interface between the tungsten oxide and α-NPD.

FIG. 13 is a diagram illustrating an energetic state at an interface between the tungsten oxide layer having the occupied energy level near the Fermi surface and an α-NPD layer.

FIG. 13 illustrates, with regards to the tungsten oxide layer (corresponding to the hole injection layer), the lowest binding energy of the valence band (illustrated as "upper end of the valence band" in FIG. 13) and the binding energy at the point at which the spectral rise near the Fermi surface begins (illustrated as "upper end of the in-gap state" in FIG. 13). Seen in relation to the UPS spectrum of the tungsten oxide layer, the upper end of the valence band in FIG. 13 corresponds to point (iii) in FIG. 8, and the upper end of the in-gap state in FIG. 13 corresponds to point (iv) in FIG. 9.

In addition, FIG. 13 illustrates a thickness of the α-NPD layer and a binding energy of the HOMO of the α-NPD, in a case where the α-NPD layer (corresponding to the functional layer) is disposed on the tungsten oxide layer. Furthermore, a vacuum level of each of tungsten oxide layer and the α-NPD layer is provided as well, in relation to the other energy levels illustrated. Here, the binding energy of the HOMO of the α-NPD layer corresponds to the binding energy at a point at which a peak of binding energy corresponding to the HOMO begins in the UPS spectrum of the α-NPD layer.

More specifically, the energy diagram illustrated in FIG. 13 is obtained through repeated alternate execution of the UPS measurement and the ultra high vacuum vapor deposition, where the tungsten oxide layer formed on the ITO substrate is transferred back and forth between a photoelectron spectroscopy device and a ultra high vacuum vapor deposition device connected to the photoelectron spectroscopy device. Since the occurrence of charge-up was not encountered during the UPS measurement, the binding energy on the vertical axis in FIG. 13 is indicated as an absolute value taken with respect to a reference point, which is the Fermi surface of the ITO substrate.

It could be seen in FIG. 13 that, at least within a 0-0.3 nm distance from the surface of the α-NPD layer facing the tungsten oxide layer, or that is, in a vicinity of the interface between the tungsten oxide layer and the α-NPD layer, the upper end of the in-gap state of the tungsten oxide layer and the HOMO of the α-NPD layer are substantially equivalent in terms of binding energy. Thus, a state can be seen where, so to speak, the energy levels of the tungsten oxide layer and the α-NPD layer are in alignment with each other (hereinafter, this state is referred to as an "interface energy level alignment"). Here, it should be noted that the state of "substantially equivalent" as referred to in the above actually includes a state where a slight difference exists between the binding energies of the two layers, and denotes a range of ±0.3 eV inclusive, to be specific.

Further, it can be seen from FIG. 13 that the interface energy level alignment is formed as a result of interaction between the tungsten oxide and the α-NPD, and not by mere coincidence. Refer to the following for reasons as to why such an indication can be made.

For instance, the change in vacuum level (vacuum level shift) observed at the interface between the tungsten oxide layer and the α-NPD layer indicates that an electrical double layer (EDL) is formed at the interface. Further, considering the direction in which the vacuum level shift is oriented, it can be seen that the EDL is formed to be negative in the direction of the tungsten oxide layer, and positive in the direction of the α-NPD layer. In addition, since the magnitude of the vacuum level shift is considerably large at around 2 eV, it could be reasonably assumed that the EDL has been formed as a result of some type of effect that is similar to a chemical bond. Thus, it can be reasonably assumed that the interface energy level alignment has been formed as a result of interaction between the tungsten oxide and the α-NPD.

Further, the inventors of the present invention assume that the interaction, in specific, is caused by a mechanism as described in the following.

First of all, the occupied energy level near the Fermi surface derives from the 5d orbital of a tungsten atom, as description has already been made in the above. In the following, the 5d orbital of the tungsten atom is referred to as a "W5d orbital corresponding to the spectral protrusion".

When the HOMO of an α-NPD molecule approaches the W5d orbital corresponding to the spectral protrusion at the surface of the tungsten oxide layer, an electron transfers from the HOMO of the α-NPD molecule to the W5d orbital corresponding to the spectral protrusion. Such transfer of an electron takes place since both the tungsten oxide layer and the α-NPD molecule seek for stabilization of energetic state. Hence, an EDL is formed at the interface between the tungsten oxide layer and the α-NPD layer, which brings about a vacuum level shift and an interface energy level alignment.

More specifically, many reports have been made, as a result of first principles calculations, that the HOMO of an α-NPD molecule is characterized in that: (i) the probability density thereof exhibits an uneven distribution of the HOMO near a nitrogen atom in an amine structure of the α-NPD molecule; and thus, (ii) the structure thereof includes, as the main composing element, a lone pair of electrons of a nitrogen atom. According to this, it could be assumed that, at the interface between the tungsten oxide layer and the layer of an organic amine-containing molecule, an electron transfers from the lone pair of electrons of the nitrogen atom in the amine structure of the amine-containing molecule, to the W5d orbital corresponding to the spectral protrusion.

The fact that there are reports made of interface energy level alignments, similar to the interface energy level alignment between the tungsten oxide layer and the α-NPD layer illustrated in FIG. 13, at interfaces formed between a vapor deposition film of molybdenum oxide and each of α-NPD and F8BT supports this assumption (refer to Non-Patent Literatures 3, 4, and 5). Note that molybdenum oxide has a physical property similar to tungsten oxide, as description has already made in the above, and further, α-NPD and F8BT are commonly organic amine-containing molecules.

The excellent hole injection efficiency of the hole injection layer of the organic EL element pertaining to the present invention can be explained according to the interface energy level alignment as described in the above. That is, an interface energy level alignment occurs between the hole injection layer composed of tungsten oxide that has the occupied energy level near the Fermi surface and the adjacent functional layer. As a result, the binding energy at the point at which the spectral protrusion corresponding to the occupied energy level near the Fermi surface begins and the binding energy of the HOMO of the functional layer become substantially equivalent. The injection of holes takes place between such energy levels having the interface energy level alignment formed therebetween. Therefore, the hole injection barrier to be overcome when injecting holes to the HOMO of the functional layer is minimized to such an extent as could be ignored.

However, as description has been already provided in the above, the occupied energy level near the Fermi surface is formed by factors such as oxygen vacancy and structures similar thereto, and further, it is quite unlikely, in reality, that tungsten oxide exists that is completely free of all such factors. Hence, for instance, it can be reasonably assumed that, even in such tungsten oxide as used to prepare the above-mentioned sample devices B and C, which does not exhibit the spectral protrusion near the Fermi surface in the photoelectron spectroscopy spectrum, oxygen vacancy and structures similar thereto exist, however minimal they may be in terms of number.

In view of this, hereinafter, explanation is provided, with reference to FIG. 14, of the reason for which the hole-only element HOD-A and the organic EL element BPD-A, both having the hole injection layer 3 which corresponds to the tungsten oxide layer 8 of the sample device A, exhibit excellent hole injection efficiency as observed through the above experiments.

To bring about the interaction between the HOMO of the organic molecule composing the functional layer and the occupied energy level near the Fermi surface of the tungsten oxide layer when disposing the tungsten oxide layer on the functional layer, the following condition needs to be fulfilled. That is, a portion of the organic molecule where the probability density of the HOMO is high, and an oxygen vacancy or a structure similar thereto of the tungsten oxide layer (illustrated as "injection site A" in FIG. 14) must approach each other to a distance at which the interaction is triggered (fall into contact with each other). The portion of the organic molecule where the probability density of the HOMO is high (illustrated as "injection site B" in FIG. 14) is, for instance, a nitrogen atom in the amine structure of an organic amine-containing molecule.

Figure 14A:
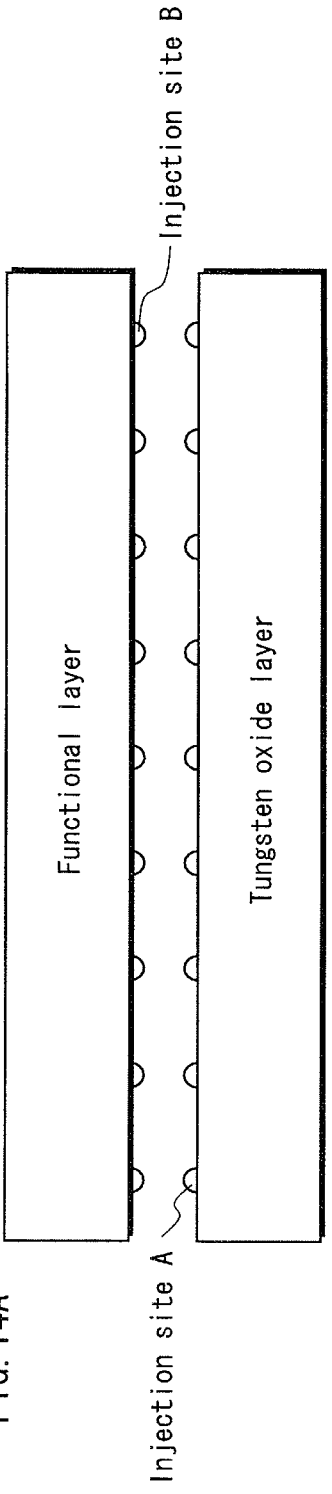
FIGS. 14A and 14B are diagrams for explanation of effects yielded by injection sites of the hole injection layer and a functional layer.
Figure 14B:
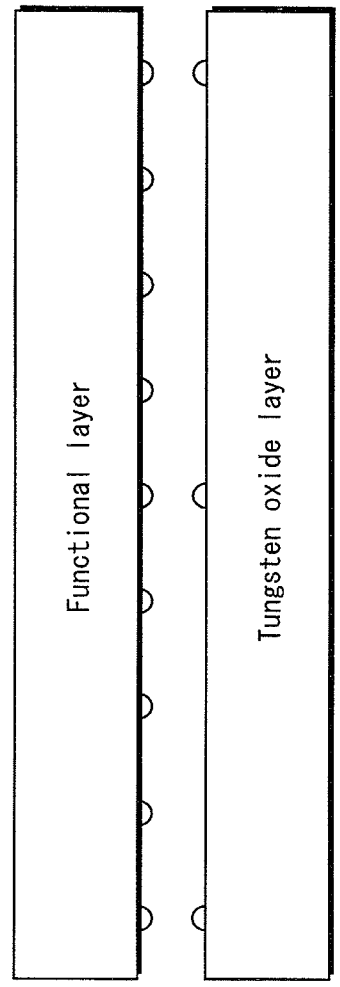

However, in a tungsten oxide layer as incorporated in the sample devices B and C, the number density of the injection site A, if any, is extremely small, as illustrated in FIG. 14B. Accordingly, the upward protrusion near the Fermi surface does not appear in the UPS spectra thereof. Thus, the possibility of the injection site A and the injection site B falling into contact is extremely low. Since the injection of holes takes place where the injection site A and the injection site B fall into contact, it is clear that hole injection efficiency in sample devices B and C is extremely low.

In contrast to this, an abundance of injection sites A exists in the tungsten oxide layer which exhibits the spectral protrusion near the Fermi surface, as illustrated in FIG. 14A. Note that the tungsten oxide layer exhibiting the spectral protrusion near the Fermi surface is, for instance, the tungsten oxide layer incorporated in the above-mentioned sample device A. Thus, there is a high possibility of the injection sites A and the injection sites B falling into contact, and therefore the tungsten oxide layer exhibits excellent hole injection efficiency.

When summarizing the description provided in the above, the excellent hole injection efficiency of the organic EL element pertaining to the present invention can be explained as follows.

Firstly, a hole injection layer composed of tungsten oxide exhibits, in the photoelectron spectroscopy spectrum thereof, an upward protrusion near the Fermi surface. Such a spectral protrusion near the Fermi surface is indicative of a considerable number of oxygen vacancies and structures similar thereto existing at the surface of the hole injection layer.

The occupied energy level near the Fermi surface, the existence of which is indicated by the spectral protrusion near the Fermi surface, pulls an electron off from the organic molecule composing the functional layer adjacent to the hole injection layer. As a result, the occupied energy level near the Fermi surface establishes an interface energy level alignment with the highest occupied molecular orbital (HOMO) of the organic molecule.

As such, if a considerable number of oxygen vacancies and structures similar thereto is found at the surface region of the hole injection layer, the possibility increases of the occupied energy level near the Fermi surface and a portion of the organic molecule having a high possibility density of the HOMO falling into contact with each other. Thus, the interface energy level alignment occurs efficiently, and accordingly, the tungsten oxide layer exhibits excellent hole injection efficiency.

(Additional Matters)

The expression "occupied energy level" as referred to in the present specification includes an energy level of a so-called semi-occupied orbital, which is an electron orbital which is occupied by at least one electron.

Further, the implementation of the organic EL element of the present invention is not limited to a structure where the organic EL element is used in an independent state. A plurality of the organic EL elements of the present invention may be integrated on a substrate as pixels to form an organic EL panel. An organic EL display so yielded may be implemented by appropriately arranging the thickness of each of the layers in each of the organic EL elements.

In addition, description has been provided in the above on implementing the organic EL element of the present invention as a bottom emission type organic El element, for the sake of example. However, the present invention is not limited to this. The organic EL element of the present invention may be implemented as a top emission type organic EL element.

INDUSTRIAL APPLICABILITY

The organic EL element pertaining to the present invention is to be used as display elements for mobile phone displays and TVs, and as a light source for various applications. Regardless of the specific use thereof, the organic EL element of the present invention is applicable as an organic EL element having a wide range of luminous intensity from low luminous intensity to high luminous intensity for the use as a light source or the like, and which can be driven at a low voltage. The organic EL element of the present invention, for having such a high level of performance, may be used in a wide range of applications, including those for household use, those for use in public facilities, and those for professional use. More specifically, such applications include: various display devices; TV apparatuses; displays for portable electronic devices; illumination light sources, and etc.

What is claimed is:

1. An organic light-emitting element, comprising:
an anode;
a functional layer containing an organic material; and
a hole injection layer for injecting holes to the functional layer, the hole injection layer being between the anode and the functional layer,
wherein the hole injection layer comprises tungsten oxide, the hole injection layer is formed under conditions where a total gas pressure is higher than 2.7 pascals and at most equal to 7.0 pascals, a ratio of oxygen partial pressure to the total gas pressure is at least equal to 50% and at most equal to 70%, and an input power density of a sputtering target is at least equal to 1 W/cm$^2$ and at most equal to 2.8 W/cm$^2$, and
an ultraviolet photoelectron spectroscopy spectrum of the hole injection layer, using a He I line as a light source and a normal line direction of a surface of the substrate as an electron emission angle, exhibits an upward protrusion that is 1.8 electron volts to 3.6 electron volts lower than a lowest energy level of a valence band of the hole injection layer in terms of binding energy, the upward protrusion corresponding to an occupied energy level of the hole injection layer.

2. The organic light-emitting element of claim 1, wherein the occupied energy level at an interface between the hole injection layer and the functional layer is approximately equal to an energy level of a highest occupied molecular orbital of the functional layer in terms of the binding energy.

3. The organic light-emitting element of claim 1, wherein a gap between the occupied energy level at an interface between the hole injection layer and the functional layer and an energy level of a highest occupied molecular orbital of the functional layer is at most approximately 0.3 electron volts in terms of the binding energy.

4. The organic light-emitting element of claim 1, wherein an X-ray photoelectron spectroscopy spectrum of the hole injection layer exhibits an upward protrusion that is approximately 1.8 electron volts to approximately 3.6 electron volts lower than the lowest energy level of the valence band in terms of the binding energy.

5. The organic light-emitting element of claim 1, wherein a differential spectrum obtained by differentiating an ultraviolet photoelectron spectroscopy spectrum of the hole injection layer has a shape that is expressed by a non-exponential function throughout a range between approximately 2.0 electron volts and approximately 3.2 electron volts lower than the lowest energy level of the valence band in terms of the binding energy.

6. The organic light-emitting element of claim 1, wherein the functional layer comprises an amine-containing material.

7. The organic light-emitting element of claim 1, wherein the functional layer includes at least one of a hole transfer layer that transfers the holes, a light-emitting layer that emits light by recombination of electrons and the holes injected to the functional layer, and a buffer layer that one of adjusts optical characteristics of the organic light-emitting element and blocks electrons.

8. The organic light-emitting element of claim 1, wherein the upward protrusion is approximately 2.0 electron volts to 3.2 electron volts lower than the lowest energy level of the valence band in terms of the binding energy.

9. A display device comprising the organic light-emitting element of claim 1.

10. A manufacturing method for an organic light-emitting element, comprising:
preparing an anode;
forming a tungsten oxide layer above the anode by introducing a gas comprising an argon gas and an oxygen gas to a chamber of a sputtering device, a total pressure of the gas in the chamber being greater than 2.7 pascals and at most equal to 7.0 pascals, a partial pressure ratio of the oxygen gas with respect to the total pressure of the gas in the chamber being at least 50% and at most 70%, and an input power density per unit surface area of a sputtering target being at least 1 W/cm$^2$ and at most 2.8 W/cm$^2$;
forming a functional layer containing an organic material above the tungsten oxide layer; and
forming a cathode above the functional layer,
wherein an ultraviolet photoelectron spectroscopy spectrum of the tungsten oxide layer, using a He I line as a light source and a normal line direction of a surface of the substrate as an electron emission angle, exhibits an upward protrusion that is 1.8 electron volts to 3.6 electron volts lower than a lowest energy level of a valence band of the tungsten oxide layer in terms of binding energy, the upward protrusion corresponding to an occupied energy level of the hole injection layer.

11. The manufacturing method of claim 10, further comprising:
having a differential spectrum, obtained by differentiating an ultraviolet photoelectron spectroscopy spectrum of the tungsten oxide layer, have a shape that is expressed by a non-exponential function throughout a range between approximately 2.0 electron volts and approximately 3.2 electron volts lower than the lowest energy level of the valence band of the tungsten oxide layer in terms of the binding energy.

12. The manufacturing method of claim 10, further comprising:
having the occupied energy level at an interface between the tungsten oxide layer and the functional layer be approximately equal to an energy level of a highest occupied molecular orbital of the functional layer in terms of the binding energy.

13. The manufacturing method of claim 10, further comprising:
having a gap between the occupied energy level at an interface between the tungsten oxide layer and the functional layer and an energy level of a highest occupied molecular orbital of the functional layer be at most approximately 0.3 electron volts in terms of the binding energy.

14. The manufacturing method of claim 10, further comprising:
having an X-ray photoelectron spectroscopy spectrum of the tungsten oxide layer exhibit an upward protrusion that is approximately 1.8 electron volts to approximately 3.6 electron volts lower than the lowest energy level of the valence band in terms of the binding energy.

15. The manufacturing method of claim 10, further comprising:
having a differential spectrum, obtained by differentiating an ultraviolet photoelectron spectroscopy spectrum of the tungsten oxide layer, have a shape that is expressed by a non-exponential function throughout a range between approximately 2.0 electron volts and approximately 3.2 electron volts lower than the lowest energy level of the valence band in terms of the binding energy.

16. The manufacturing method of claim 10, further comprising:
having the upward protrusion be approximately 2.0 electron volts to 3.2 electron volts lower than the lowest energy level of the valence band in terms of the binding energy.

17. An organic light-emitting element, comprising:
an anode;
a functional layer containing an organic material; and
a hole injection layer for injecting holes to the functional layer, the hole injection layer being between the anode and the functional layer,
wherein the hole injection layer comprises tungsten oxide, and
an ultraviolet photoelectron spectroscopy spectrum of the hole injection layer, using a He I line as a light source and a normal line direction of a surface of the substrate as an electron emission angle, exhibits an upward protrusion that is 1.8 electron volts to 3.6 electron volts lower than a lowest energy level of a valence band of the hole injection layer in terms of binding energy, the upward protrusion corresponding to an occupied energy level of the hole injection layer.

* * * * *